(12) United States Patent
Inaba

(10) Patent No.: US 6,255,742 B1
(45) Date of Patent: Jul. 3, 2001

(54) SEMICONDUCTOR PACKAGE INCORPORATING HEAT DISPERSION PLATE INSIDE RESIN MOLDING

(75) Inventor: Takehito Inaba, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/166,215

(22) Filed: Oct. 5, 1998

(30) Foreign Application Priority Data

Oct. 8, 1997 (JP) .................................................. 9-275824

(51) Int. Cl.[7] .................................................. H01L 23/28
(52) U.S. Cl. ......................... 257/796; 257/675; 257/712; 257/706; 257/707; 257/666; 257/676; 257/787
(58) Field of Search .................................. 257/675, 736, 257/712, 667, 706, 707, 711, 666, 676, 787

(56) References Cited

U.S. PATENT DOCUMENTS

| | | | |
|---|---|---|---|
| 5,371,404 | * 12/1994 | Juskey et al. | 257/659 |
| 5,449,930 | 9/1995 | Zhou | 257/197 |
| 5,641,987 | * 6/1997 | Lee | 257/675 |
| 5,650,663 | * 7/1997 | Parthasarathi | 257/706 |
| 5,872,395 | * 2/1999 | Fujimoto | 257/675 |
| 5,905,299 | * 5/1999 | Lacap | 257/666 |

FOREIGN PATENT DOCUMENTS

| | | |
|---|---|---|
| 56-58867 | 5/1981 | (JP) . |
| 2-163954 | 6/1990 | (JP) . |
| 4-1502 | 1/1992 | (JP) . |
| 405021648 | * 1/1993 | (JP) . |
| 5-63113 | 3/1993 | (JP) . |
| 5-198701 | 8/1993 | (JP) . |
| 5-267503 | 10/1993 | (JP) . |
| 6-151657 | 5/1994 | (JP) . |
| 8-167681 | 6/1996 | (JP) . |
| 96-12445 | 4/1996 | (KR) . |

* cited by examiner

Primary Examiner—Tom Thomas
Assistant Examiner—Luan Thai
(74) Attorney, Agent, or Firm—Foley & Lardner

(57) ABSTRACT

The resin-molded portion of a semiconductor package encapsulates a semiconductor element mounting portion, inner leads, and a heat dispersion plate. A semiconductor element is mounted on the surface of the semiconductor element mounting portion. The inner leads are arranged around the perimeter of the semiconductor element and are electrically connected to electrodes on the surface of the semiconductor element. The heat dispersion plate has legs, and the semiconductor element mounting portion is arranged to overlap with the heat dispersion plate. A bonding layer composed of thermoplastic resin, thermosetting resin, or low-melting metal is present at least between the heat dispersion plate and the semiconductor element mounting portion. A portion of the legs of the heat dispersion plate is exposed on the bottom surface of the resin-molded portion. Outer leads that are continuous with the inner leads extend outside the resin-molded portion.

5 Claims, 22 Drawing Sheets

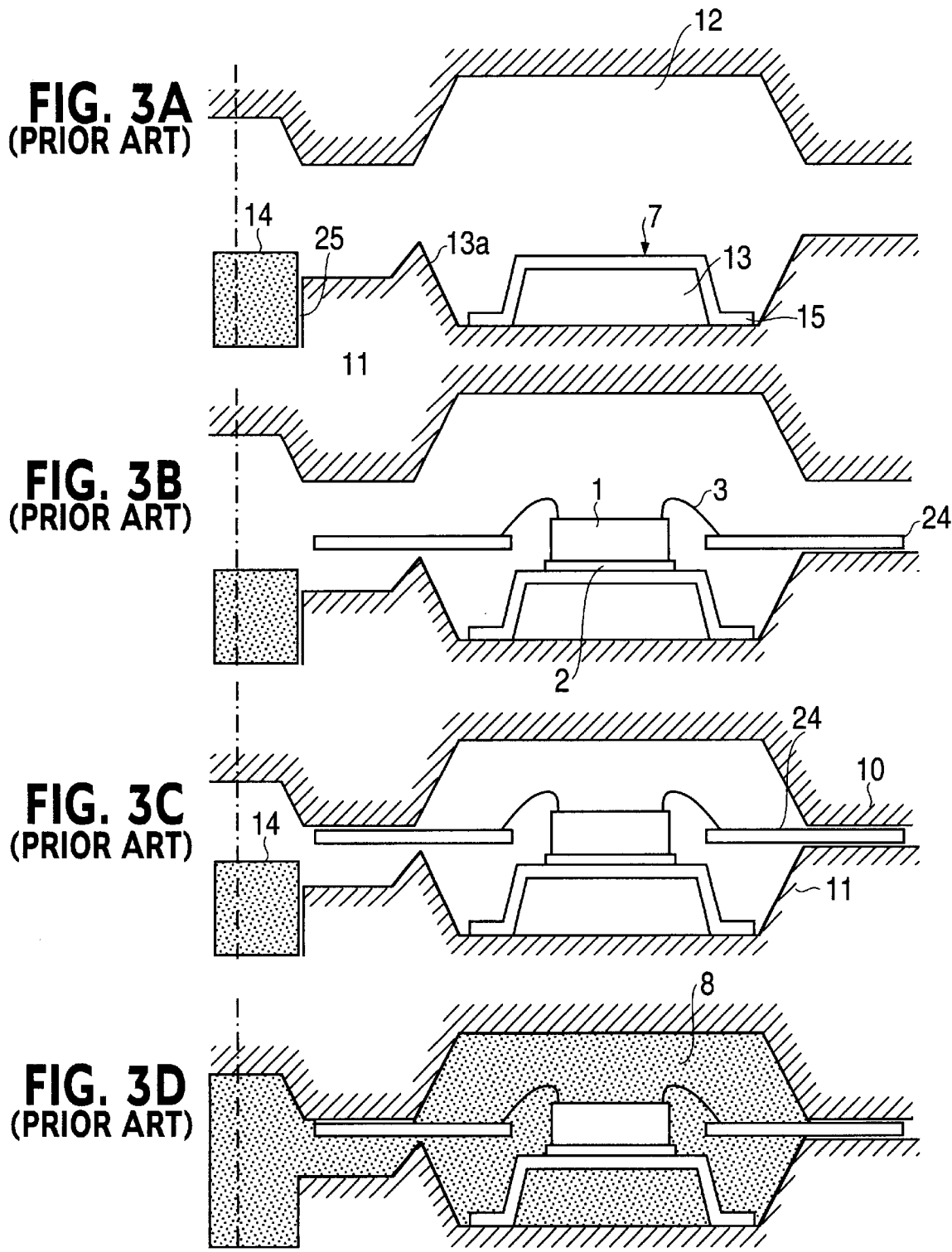

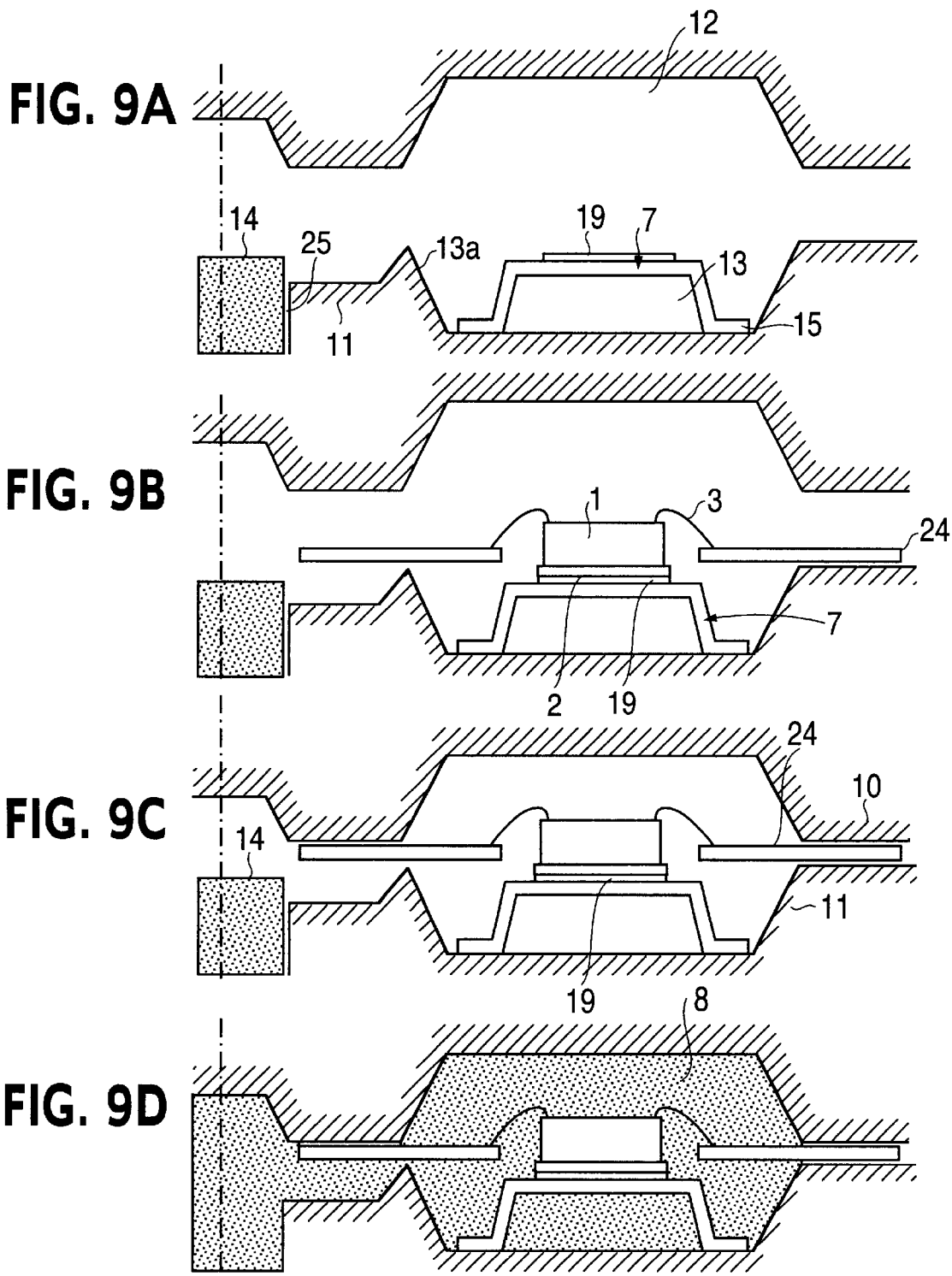

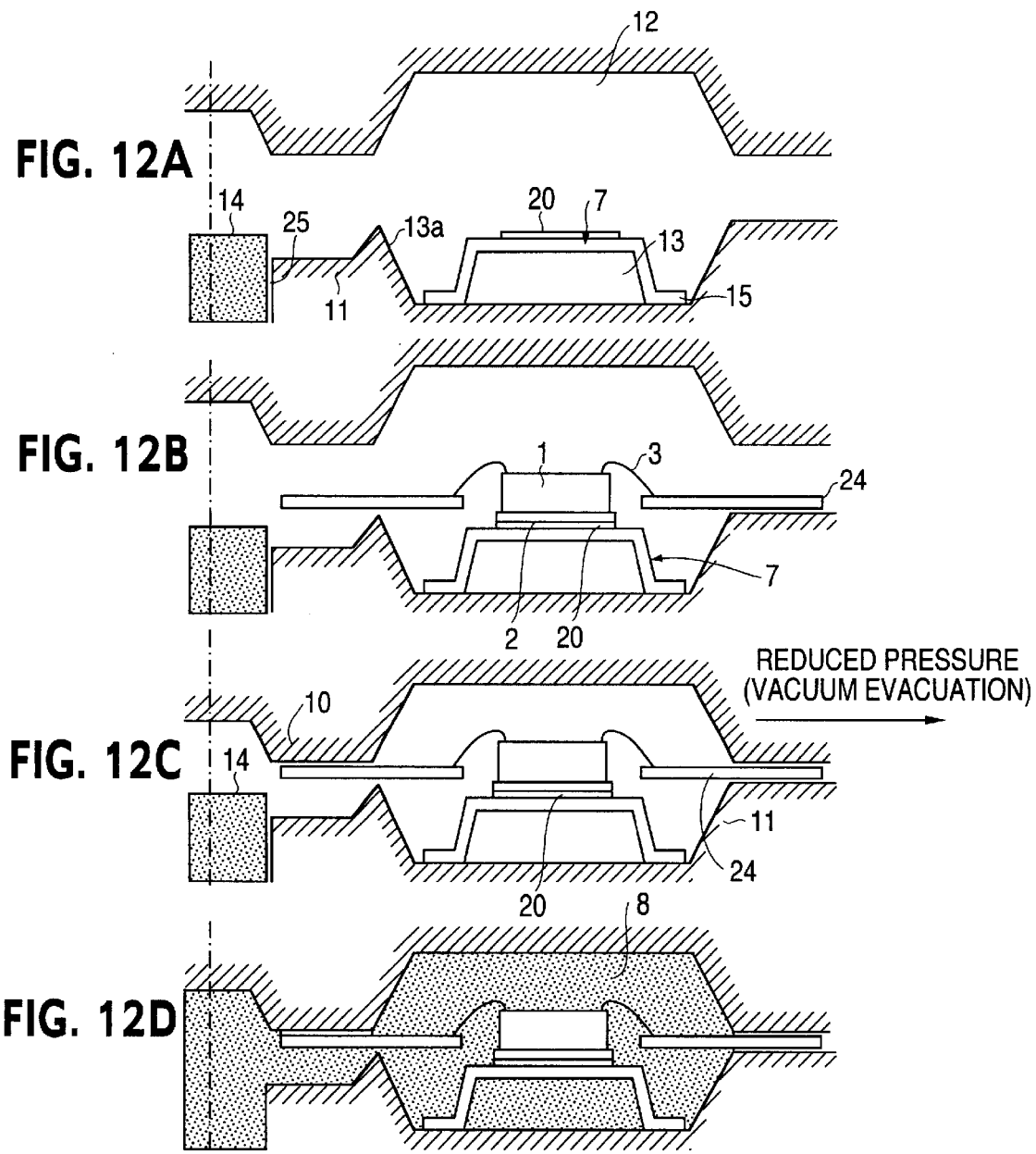

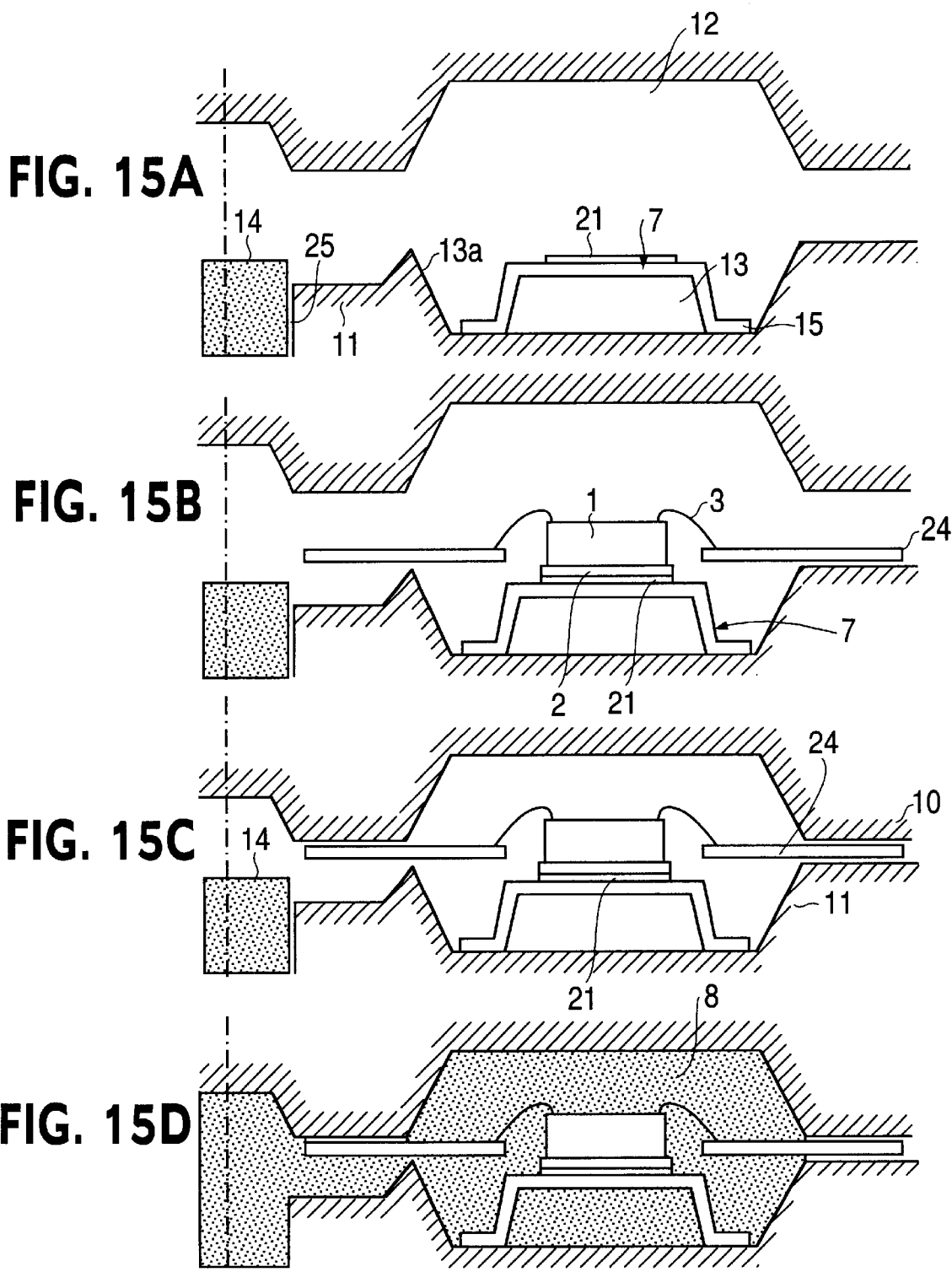

SEMICONDUCTOR PACKAGE INCORPORATING HEAT DISPERSION PLATE INSIDE RESIN MOLDING

BACKGROUND OF THE INVENTION

1. Field of the Invention

The present invention relates to a semiconductor package having low thermal resistance, and particularly to a semiconductor package incorporating a heat dispersion plate within the resin-molded portion.

2. Description of the Related Art

Explanation will first be presented with reference to FIGS. 1A and 1B regarding the structure of a semiconductor package having low thermal resistance of the prior art. This type of semiconductor package is of a construction in which, for example, a leadframe unit 27 is layered on heat dispersion plate 7.

Leadframe unit 27 includes: outer leads 6 leading out of a resin-molded portion 8; inner leads 5 extending into the resin-molded portion 8 from outer leads 6; an island 2, which is the mounting portion for a semiconductor element 1; and hanging pins 4 for securing the island 2 before the resin molding process.

The semiconductor element 1 is secured by a conductive bond such as silver paste on island 2 (omitted in the figures). Electrodes (not shown in the figures) are provided on semiconductor element 1 and are connected to inner leads 5 by bonding wires 3.

In addition, legs 15 of a heat dispersion plate 7 are formed by bending tabs provided on a circular or square thin metal plate as shown in FIGS. 2A and 2B. The tips of legs 15 are processed so as to be parallel to the installation surface of heat dispersion plate 7. The reverse surface of the tips of legs 15 are exposed on the surface of a resin-molded portion 8 on the reverse side of the package after resin molding, as shown in FIG. 1B.

Explanation is next presented with reference to FIGS. 3A–3D regarding the method of fabricating the above-described semiconductor package.

The operator first prepares heat dispersion plate 7 processed as described hereinabove and a leadframe 24 for which the bonding process has been completed. Heat dispersion a plate 7 is then placed in a cavity 13 of a lower die 11 of upper and lower dies that have been heated to a desired temperature as shown in FIG. 3A. The position of heat dispersion plate 7 is controlled at this time by an inner walls 13a of cavity 13 such that heat dispersion plate 7 does not shift on the bottom surface of cavity 13. A resin tablet 14 is next inserted in a transfer pot 25.

The operator next places leadframe 24 on lower die 11 as shown in FIG. 3B, whereby island 2 is placed on heat dispersion plate 7.

The operator then raises lower die 11 as shown in FIG. 3C and closes the die such that leadframe 24 is held by lower die 11 and an upper die 10. The closed state of the die is maintained for a prescribed time interval after closing the die to soften resin tablet 14 by the heat of lower die 11.

After resin tablet 14 has been softened by the heat of lower die 11, a tablet pressure plunger (not shown in the figure) rises to press the softened resin into cavities 12 and 13 and form resin-molded portion 8 as shown in FIG. 3D.

The closed state of the die is then maintained until the resin hardens. After the resin has hardened, lower die 11 drops and an eject pin (not shown) protrudes to remove a resin-encapsulated leadframe 24 from the die.

The low-thermal resistance semiconductor package according to the foregoing description is formed by simultaneously resin-encapsulating separately constructed leadframe unit 27 and heat dispersion plate 7 as one package. However, heat dispersion plate 7 and island 2 are only in mechanical contact and no process is employed to bond the two components by a bonding material or filler. A gap may therefore occur between island 2 and heat dispersion plate 7 in the event of even slight warping in either island 2 or heat dispersion plate 7, resulting in voids 9 (see FIG. 1B) after resin molding. Since the contact between island 2 and heat dispersion plate 7 is merely mechanical, moreover, the occurrence of minute gaps cannot be ruled out even if there is absolutely no warping in island 2 or heat dispersion plate 7 and both components are completely parallel.

The above-described semiconductor package of the prior art has the following problems:

First, the thermal resistance value is not significantly reduced because the thermal conductivity between island 2 and heat dispersion plate 7 is adversely affected by the formation of voids 9 between heat dispersion plate 7 and island 2 after resin molding.

A second problem is a decrease in the reliability of a package (also abbreviated as "PKG"). This decrease in reliability also occurs due to voids 9 that are formed between island 2 and heat dispersion plate 7 after resin molding as described hereinabove. Air inside these voids 9 expands due to heat in the reflow process when mounting a package on the circuit substrate, resulting in package cracks (the so-called "popcorn effect").

A third problem is the possibility of electrical shorts caused by contact between the tips of inner leads 5 and heat dispersion plate 7. Such shorts result from constructions that place island 2 and heat dispersion plate 7 in contact. In other words, when a leadframe lacking a dimple process (a leadframe in which the island has no down-offset toward the inner lead formation surface) is used in this package, contact may occur between inner leads 5 and heat dispersion plate 7 because there is no difference in height between island 2 and inner leads 5.

Leadframes normally used in this construction undergo dimple processing, whereby a difference in height between inner leads 5 and heat dispersion plate 7 that is equal to the amount of dimpling can be guaranteed even if island 2 and heat dispersion plate 7 are placed in contact.

However, the amount of dimpling of the leadframe is normally on the order of 150–200 $\mu$m, meaning that a gap of only 150–200 $\mu$m can be assured between inner leads 5 and heat dispersion plate 7, and shorts may occur between inner leads 5 and heat dispersion plate 7 in the event of shifting (floating) of heat dispersion plate 7 caused by the flow of resin when forming resin-molded portion 8.

As a fourth problem, the extensive surfaces of the tips of legs 15 of heat dispersion plate 7 that are exposed from resin-molded portion 8 results in a decrease in the moisture resistance of the package. This problem results in part from shape of the tips of legs 15 of heat dispersion plate 7, which are formed parallel to the installation surface of heat dispersion plate 7.

SUMMARY OF THE INVENTION

It is an object of the present invention to provide a semiconductor package that allows a decrease in the thermal resistance of a package.

Another object of the present invention is to provide a semiconductor package that is capable of preventing the occurrence of package cracks during a reflow process.

Yet another object of the present invention is to provide a semiconductor package that is capable of preventing shorts between the inner leads and the heat dispersion plate.

Still another object of the present invention is to provide a semiconductor package having improved moisture resistance.

In the semiconductor package according to the present invention, the heat dispersion plate and the semiconductor element mounting portion inside the resin-molded portion are bonded together by, for example, resin that forms the resin-molded portion, thermoplastic resin, thermosetting resin, or low-melting metal.

Thermal conductivity between the two components is therefore excellent and thermal resistance of the package can be decreased because voids are not present between the heat dispersion plate and the semiconductor element mounting portion.

In the semiconductor package of this invention, the area of head dispersion plate beyond the area of overlap with the semiconductor element mounting portion is preferably a flat portion that is offset away from the inner leads. This construction can prevent the occurrence of shorts between the inner leads and the heat dispersion plate.

In a semiconductor package according to the present invention, moreover, the tips of the legs of the heat dispersion plate are formed as acute angles, and the angle of the tips of the legs with respect to the installation surface of the heat dispersion plate is preferably made 0° or more. With this construction, the portions of the heat dispersion plate that are exposed at the package surface become points, and the extremely small exposed surfaces thus improve the moisture resistance of the package.

The fabrication method of the semiconductor package according to the present invention basically includes: a step for placing a heat dispersion plate in the cavity of the lower die of an upper and lower die; a step for placing a leadframe for which the bonding process has been completed on the heat dispersion plate such that the semiconductor element mounting portion lies over the heat dispersion plate; a step for closing the upper die and the lower die so as to enclose the leadframe; and a step for filling the cavity formed by the upper die and the lower die with resin.

When fabricating a semiconductor package in which the heat dispersion plate and the semiconductor element mounting portion are bonded by the resin that forms the resin-molded portion using this fabrication process, the heat dispersion plate preferably includes bumps for supporting the semiconductor element mounting portion and slits for penetrating the resin that forms the resin-molded portion in at least the area of the heat dispersion plate that overlaps with the semiconductor element mounting portion. When a heat dispersion plate having these bumps and slits is used in this way, the semiconductor element mounting portion can be supported by the bumps and a space can be provided between the heat dispersion plate and the semiconductor element mounting portion when the leadframe is placed on the heat dispersion plate. As a result, in the step for filling with resin that forms the resin-molded portion, the space between the heat dispersion plate and the semiconductor element mounting portion can be filled with resin through the slits in the heat dispersion plate even in the event of warping in the heat dispersion plate or the semiconductor element mounting portion.

When fabricating a semiconductor package in which the heat dispersion plate and the semiconductor element mounting portion are bonded together by thermoplastic resin, thermosetting resin, or low-melting metal, the thermoplastic resin, thermosetting resin, or low-melting metal is preferably coated or applied in advance to at least the area of the heat dispersion plate that overlaps with the semiconductor element mounting portion. By using this method, the thermoplastic resin, thermosetting resin, or low-melting metal changes state due to the heat of the metal die in the step for placing the heat dispersion plate inside the cavity of the lower die. The heat dispersion plate and the semiconductor element mounting portion can then be bonded by way of the thermoplastic resin, thermosetting resin, or low-melting metal by placing the leadframe on the heat dispersion plate. Finally, the bond between the heat dispersion plate and the semiconductor element mounting portion is strengthened in the step for injecting the resin that forms the resin-molded portion because this resin puts pressure on the heat dispersion plate and the semiconductor element mounting portion.

Due to the above-described features, no voids occur between the semiconductor element mounting portion and the heat dispersion plate after hardening of the resin, and thermal conductivity between the heat dispersion plate and the semiconductor element mounting portion becomes excellent after completion of the package. In addition, package cracks (popcorn effect) due to thermal stress during reflowing does not occur because no voids are present between the semiconductor element mounting portion and the heat dispersion plate in the completed package.

In each of the above-described modifications of the semiconductor package fabrication method, the portion of the heat dispersion plate beyond the area that overlaps with the semiconductor element mounting portion is preferably processed in advance in the step for preparing the heat dispersion plate into a flat portion that is offset to allow separation from the inner leads. This fabrication method can maintain ample space between the inner leads and the heat dispersion plate and therefore decrease the incidence of shorts between the inner leads and the heat dispersion plate due to resin flow during resin molding.

In addition, the legs of the heat dispersion plate for placing the heat dispersion plate on the bottom surface of the lower die cavity are preferably formed in the step for preparing the heat dispersion plate by both pointing the tips of tabs provided on the metal plate and bending the bases of the tabs.

With this fabrication method, the exposed portions of the heat dispersion plate that are exposed to the reverse surface of the resin-molded portion in the completed package can be reduced to points and the exposed area can be drastically decreased, thereby improving the moisture resistance of the package.

The above and other objects, features, and advantages of the present invention will become apparent from the following description with reference to the accompanying drawings which illustrate examples of the present invention.

BRIEF DESCRIPTION OF THE DRAWINGS

FIGS. 3A–3D are views illustrating the resin molding processes of the semiconductor package shown in FIGS. 1A and 1B;

FIGS. 9A–9D show the resin molding processes of the semiconductor package shown in FIGS. 7A and 7B;

FIGS. 12A–12D show the resin molding processes of the semiconductor Package shown in FIGS. 10A and 10B;

FIGS. 15A–15D show the resin molding processes of the semiconductor package shown in FIGS. 13A and 13B;

DETAILED DESCRIPTION OF THE PREFERRED EMBODIMENTS

First Embodiment

Figure 1A:
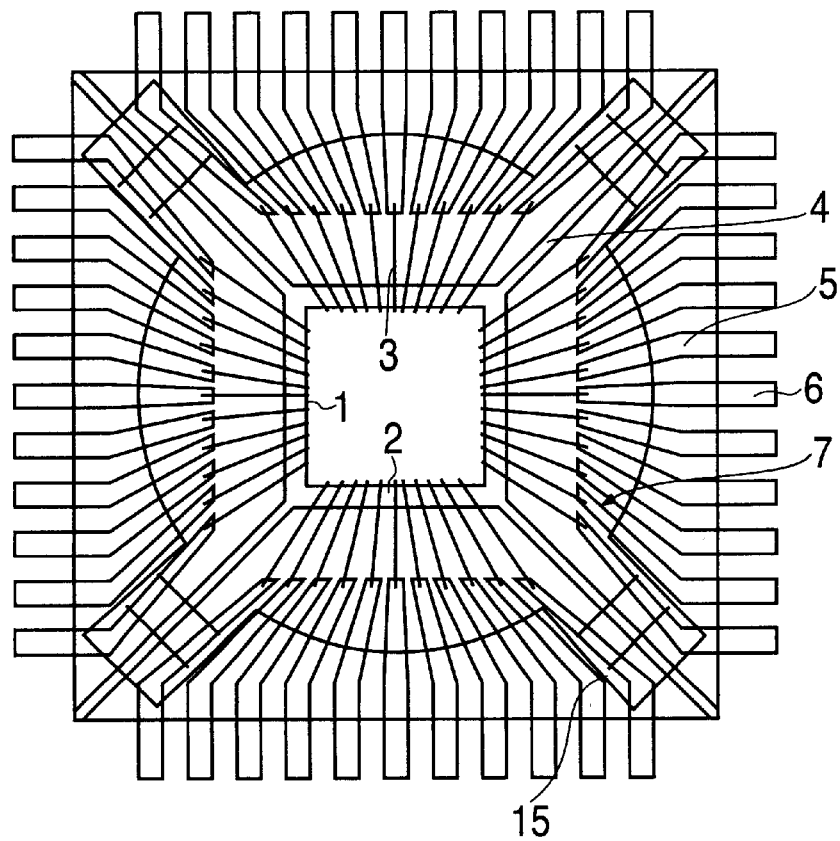
FIG. 1A is a see-through plan view showing the structure of a low thermal resistance semiconductor package according to the prior art.
Figure 1B:
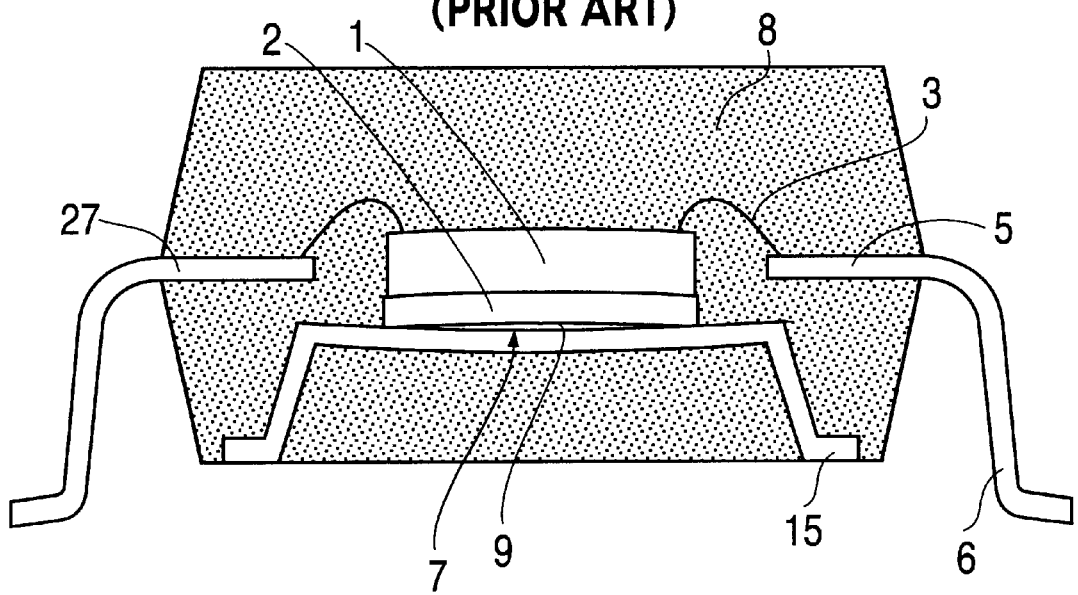
FIG. 1B is a vertical section showing the same semiconductor package.
Figure 2A:
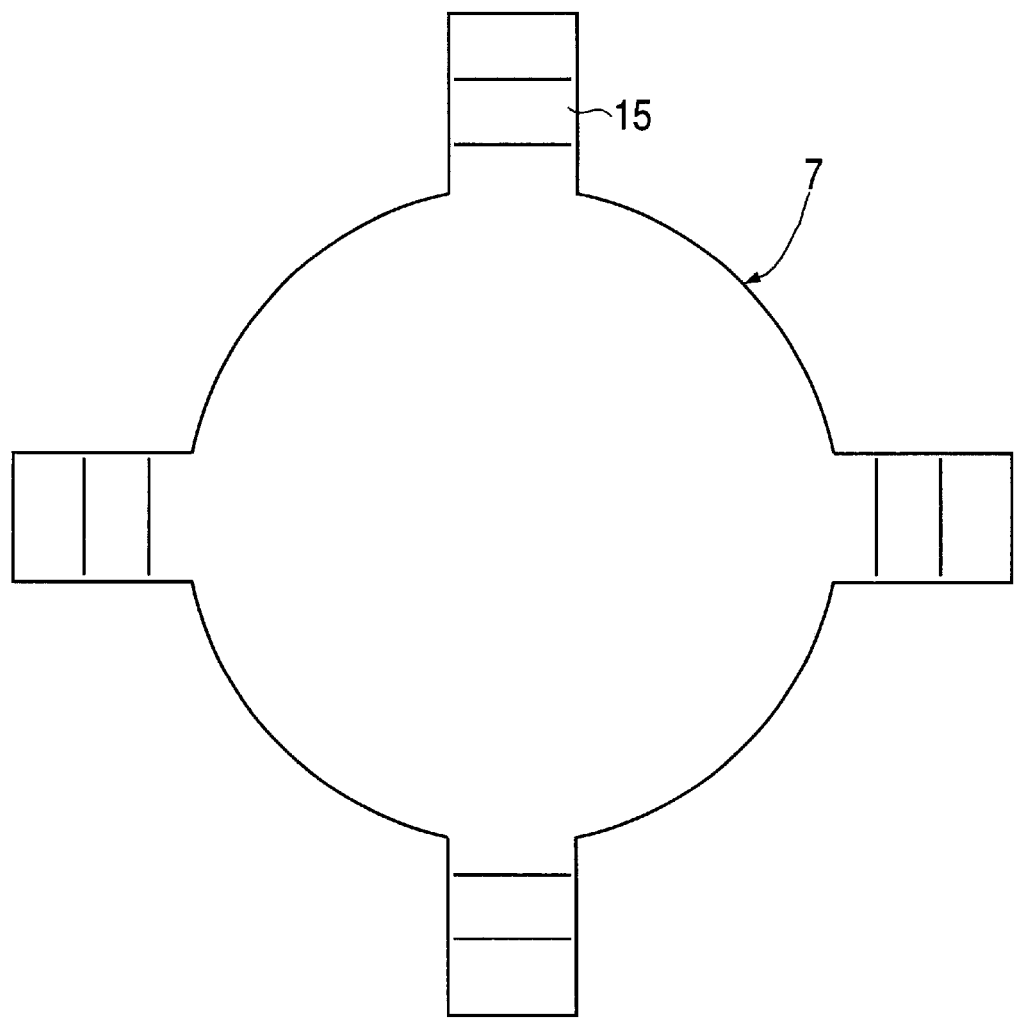
FIG. 2A is a view of the upper surface of the heat dispersion plate shown in FIGS. 1A and 1B.
Figure 2B:
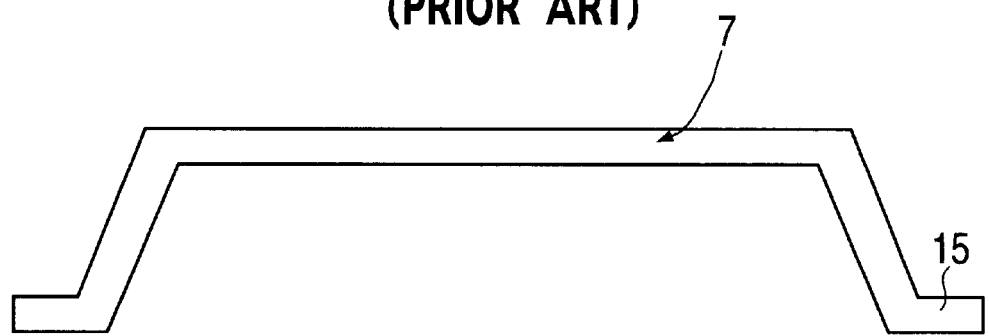
FIG. 2B is vertical section showing the heat dispersion plate.
Figure 4A:
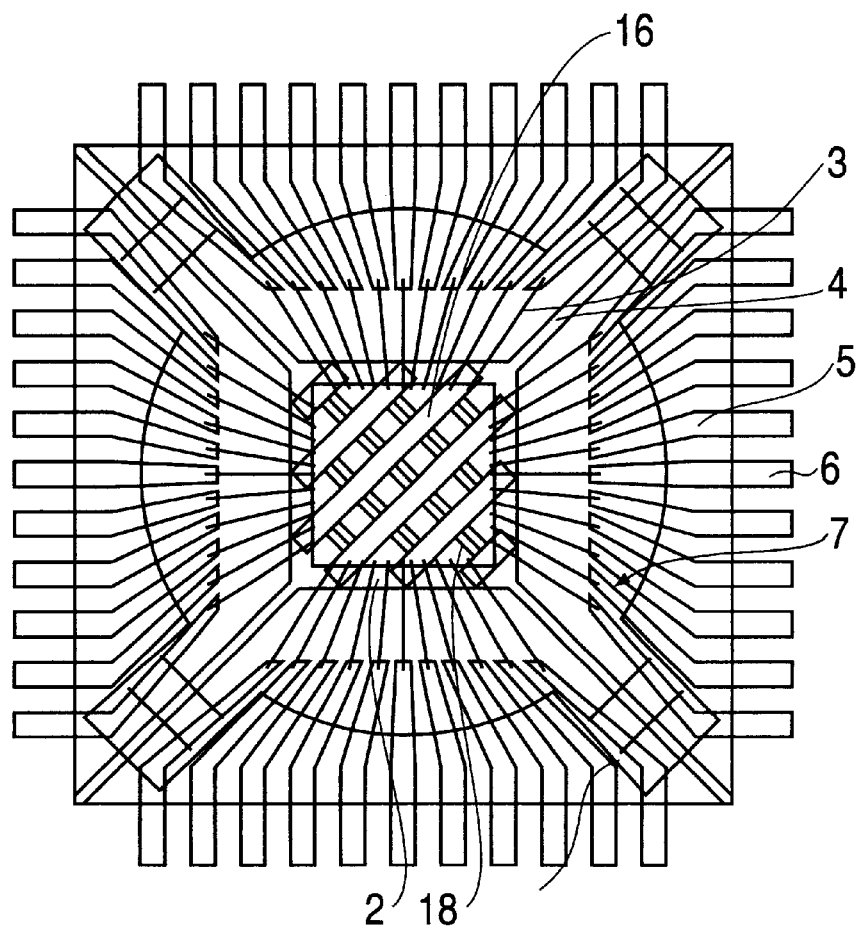
FIG. 4A is a see-through plan view showing the structure of a semiconductor package according to the first embodiment of the present invention.
Figure 4B:
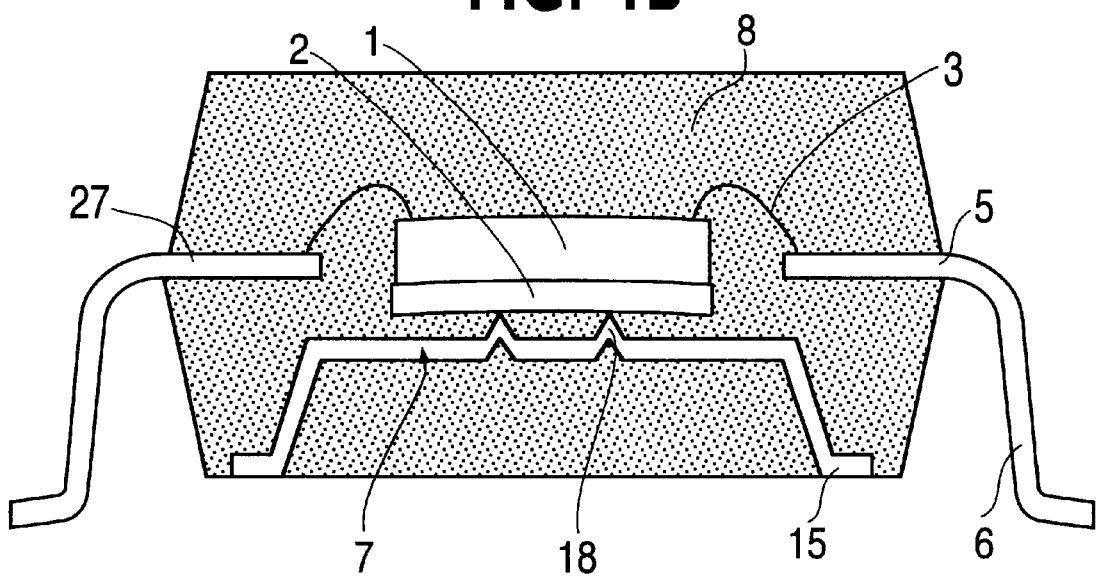
FIG. 4B is a vertical section of the semiconductor package.

Referring to FIGS. 4A and 4B, the semiconductor package of this embodiment has a construction in which leadframe unit 27 is layered on heat dispersion plate 7, as in the prior art. In this embodiment, however, island 2 is supported by bumps 18 formed on heat dispersion plate 7. A gap is formed between island 2 and heat dispersion plate 7 by bumps 18, and island 2 and heat dispersion plate 7 are bonded together by the filling of this gap by the resin that forms resin-molded portion 8. Otherwise, the structure of leadframe unit 27, the method of securing semiconductor element 1 to island 2, and the method of connecting electrodes on semiconductor element 1 to inner leads 5 are all equivalent to the prior art.

Figure 5A:
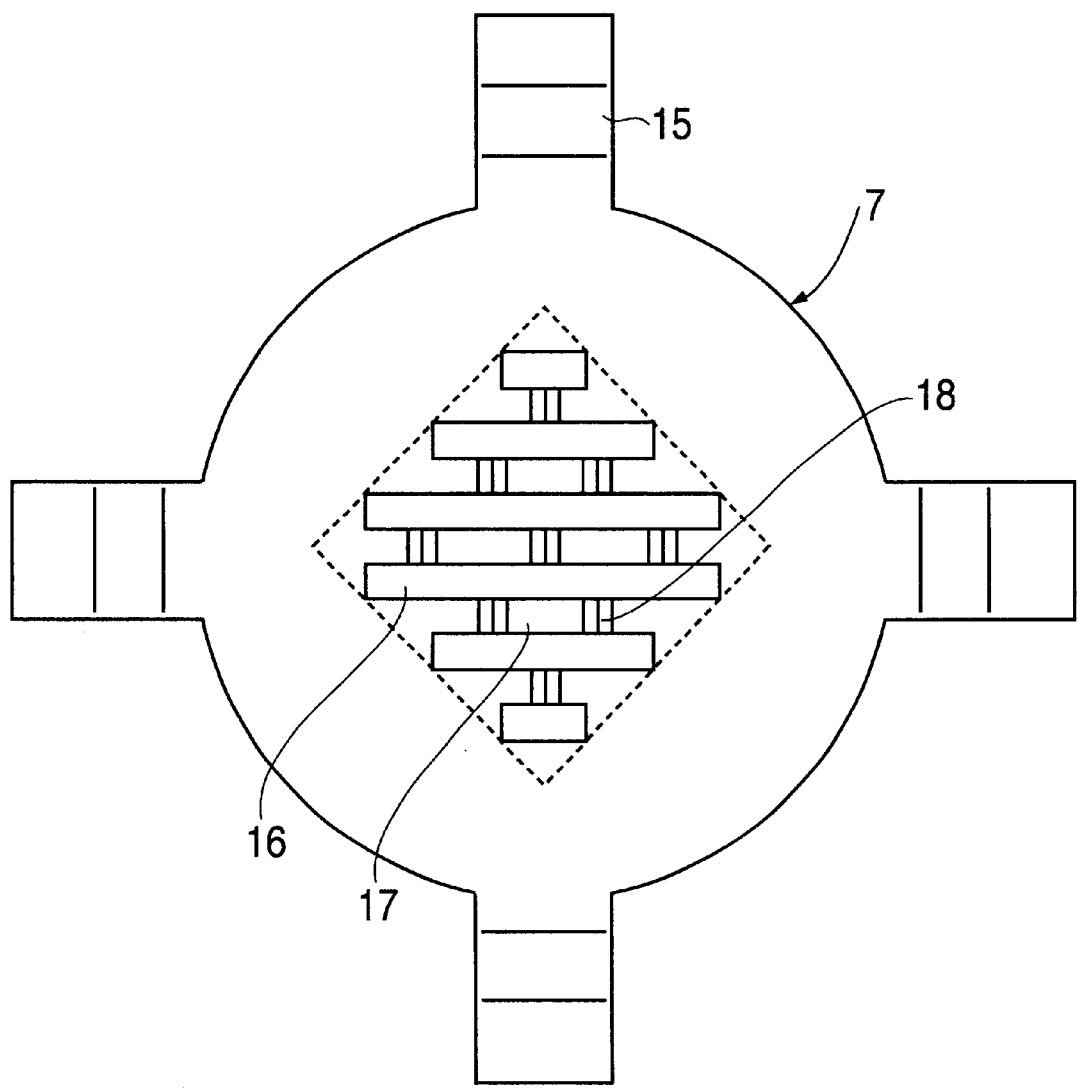
FIG. 5A is a view of the upper surface of the heat dispersion plate shown in FIGS. 4A and 4B.
Figure 5B:
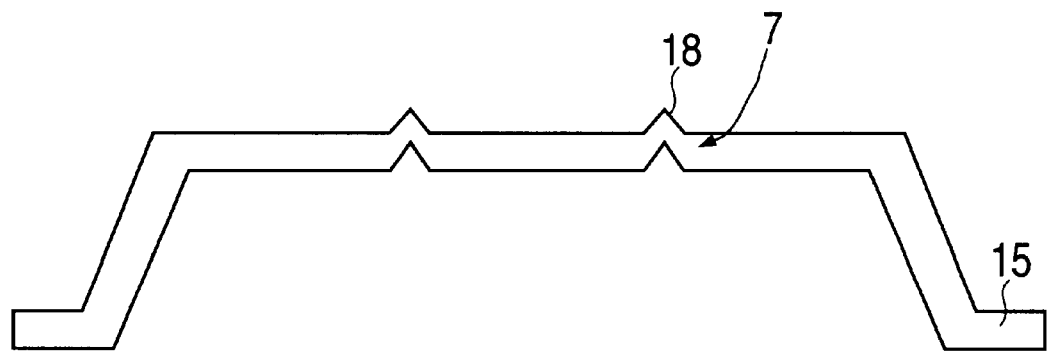
FIG. 5B is a vertical section of the heat dispersion plate.

Legs 15 of heat dispersion plate 7 are formed by bending tabs provided on a circular or square thin plate 0.1–10.2 mm thick and composed of copper alloy or 42 alloy(Cu-42%Zn) as shown in FIGS. 5A and 5B. The tips of legs 15 are processed so as to be parallel to the installation surface of heat dispersion plate 7. The reverse surface of the tips of legs 15 are exposed on the surface of resin-molded portion 8 on the bottom surface of the package after resin molding, as shown in FIG. 4B.

In addition, resin flow slits 16 about 0.1–0.2 mm wide are provided in at least the area in which island 2 and heat dispersion plate 7 overlap (represented by dotted lines in FIG. 5A). Finally, bumps 18 about 0.1–0.3 mm high are formed by bending frames 17 approximately 0.2–0.5 mm wide between slits 16.

Explanation is next presented with reference to FIGS. 6A–6D regarding the fabrication method of the semiconductor package of this embodiment.

Figure 6A:
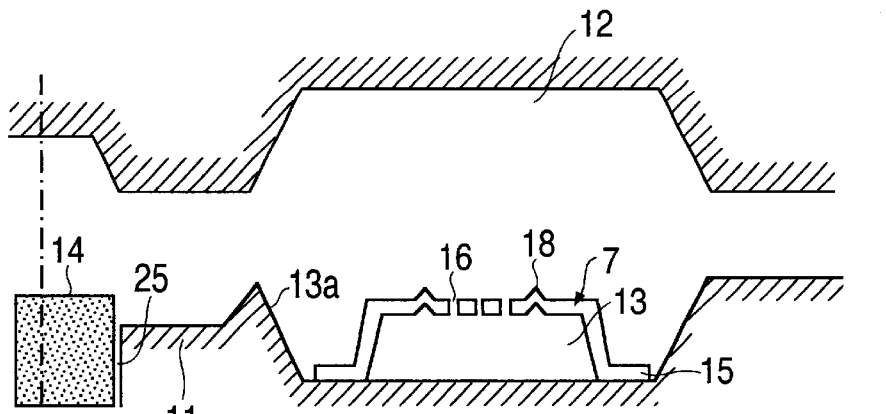
FIGS. 6A–6D show the resin-molding processes of the semiconductor package shown in FIGS. 4A and 4B.

The operator prepares in advance heat dispersion plate 7 that has been processed as described hereinabove and a leadframe 24 for which the bonding process has been completed. As shown in FIG. 6A, the operator then places heat dispersion plate 7 in a cavity 13 of a lower die 11 of an upper and a lower die that have been heated to a desired temperature (for example, 160–190° C.). At this time, the position of heat dispersion plate 7 is controlled by an inner walls 13a of cavity 13 such that heat dispersion plate 7 does not shift on the bottom surface of cavity 13. In this case, the clearance between the tips of legs 15 of heat dispersion plate 7 and inner walls 13a of cavity 13 is preferably on the order of 0.2–0.5 mm. A resin tablet 14 is then introduced into a transfer pot 25 after this positioning of heat dispersion plate 7.

Figure 6B:
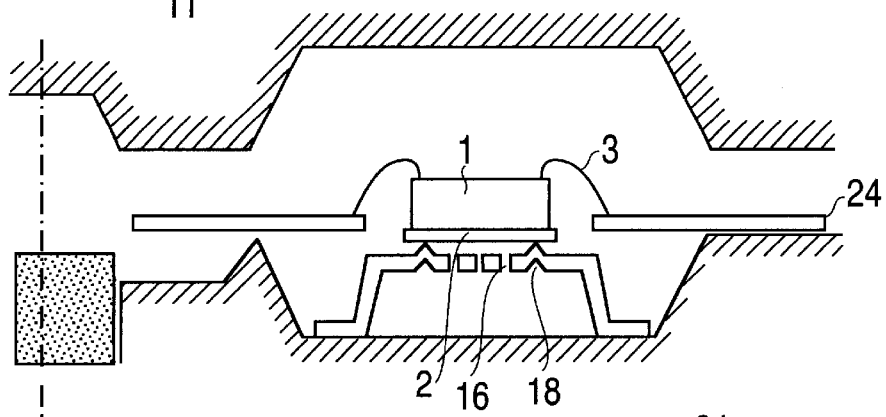

The operator next places leadframe 24 on the lower die 11 as shown in FIG. 6B. At this time, bumps 18 provided on heat dispersion plate 7 come into contact with island 2 to form a gap on the order of 0.1–0.3 mm between heat dispersion plate 7 and island 2.

Figure 6C:
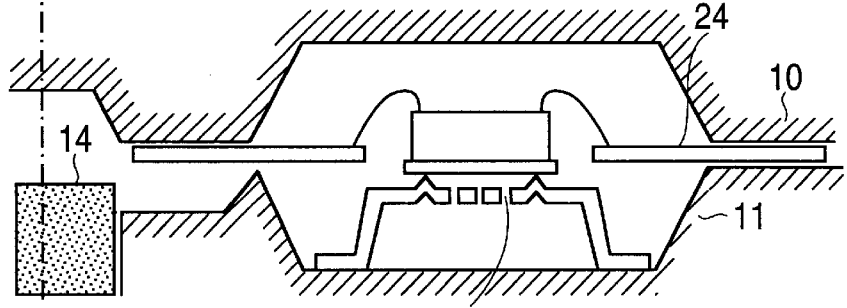

The operator then raises lower die 11 as shown in FIG. 6C and closes lower die 11 and an upper die 10 to enclose leadframe 24 by lower die 11 and upper die 10. After closing the dies, the closed state of the dies is maintained for a prescribed time (for example, 3–8 seconds) to soften resin tablet 14 by the heat of lower die 11.

Figure 6D:
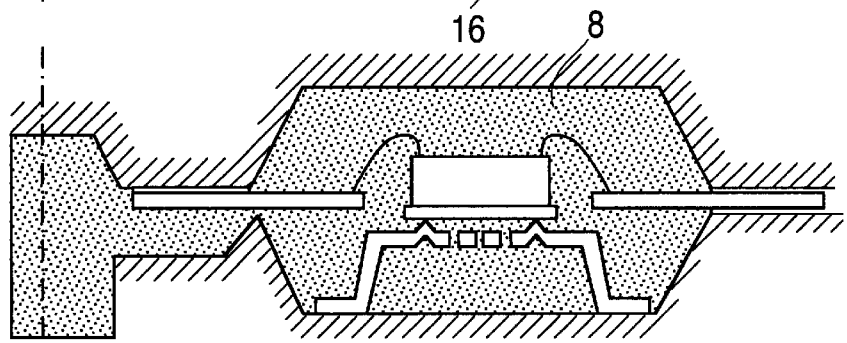

After resin tablet 14 has been softened by the heat of lower die 11, a tablet pressure plunger (omitted in the figures) rises to press the softened resin into cavities 12 and 13 as shown in FIG. 6D and form resin-molded portion 8. At this time, the softened resin passes through resin-flow slits 16 formed in heat dispersion plate 7 and fills the gap between heat dispersion plate 7 and island 2 that is formed by bumps 18.

The closed state of the dies is then maintained until the resin hardens (approximately 50–90 seconds). After the resin has hardened, lower die 11 drops, and an eject pin (omitted in the figures) protrudes to remove a resin-encapsulated leadframe 24 from the dies.

As described hereinabove, the semiconductor package of this embodiment is constructed as one package by simultaneously resin-encapsulating separately constructed leadframe unit 27 and heat dispersion plate 7. The resin that forms resin-molded portion 8 flows through slits 16 of heat dispersion plate 7 into the gap formed by bumps 18 between heat dispersion plate 7 and island 2 and fills the gap, thereby bonding together heat dispersion plate 7 and island 2.

Tables 1 and 2 show the differences in the thermal resistance values and the rate of incidence of package cracks for packages of the prior art and this embodiment. As can be seen from the tables, this embodiment can reduce the thermal resistance of a package and can prevent the incidence of package cracks (popcorn effect) during the reflow process.

TABLE 1

|  | Prior art | Present invention |
|---|---|---|
| Thermal resistance (28 mm□ QFP of 208 p) | 29.6 (° C./W) | 22.6 (° C./W) |

TABLE 2

|  | Prior art | Present invention |
|---|---|---|
| Rate of incidence of package cracking (after reflow) | 7/100 (7.0%) | 0/100 (0.0%) |

Second Embodiment

Figure 7A:
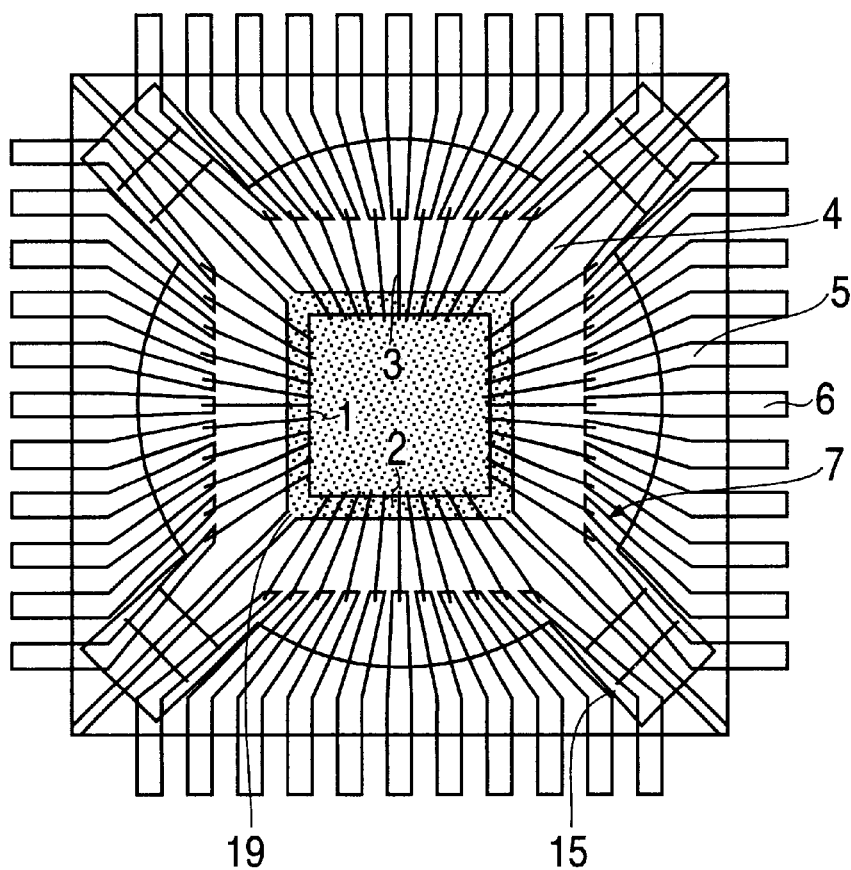
FIG. 7A is a see-through plan view showing the structure of the semiconductor package according to the second embodiment of the present invention.
Figure 7B:
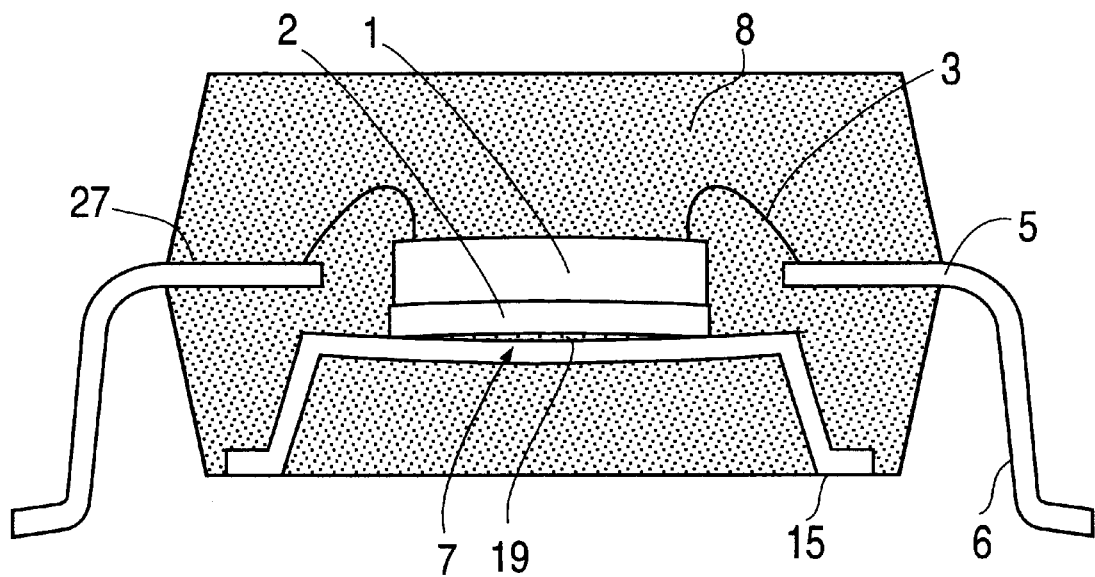
FIG. 7B is a vertical section of the semiconductor package.

Referring to FIGS. 7A and 7B, the semiconductor package according to this embodiment has a construction in which leadframe unit 27 is layered on heat dispersion plate 7 as in the prior art. In this embodiment, however, island 2 and heat dispersion plate 7 are bonded together by coating or applying a thermoplastic resin 19 to heat dispersion plate 7. Otherwise, the construction of leadframe unit 27, the method of securing semiconductor element 1 to island 2, and the method of connecting inner leads 5 to the electrodes on semiconductor element 1 are all equivalent to the prior art.

Figure 8A:
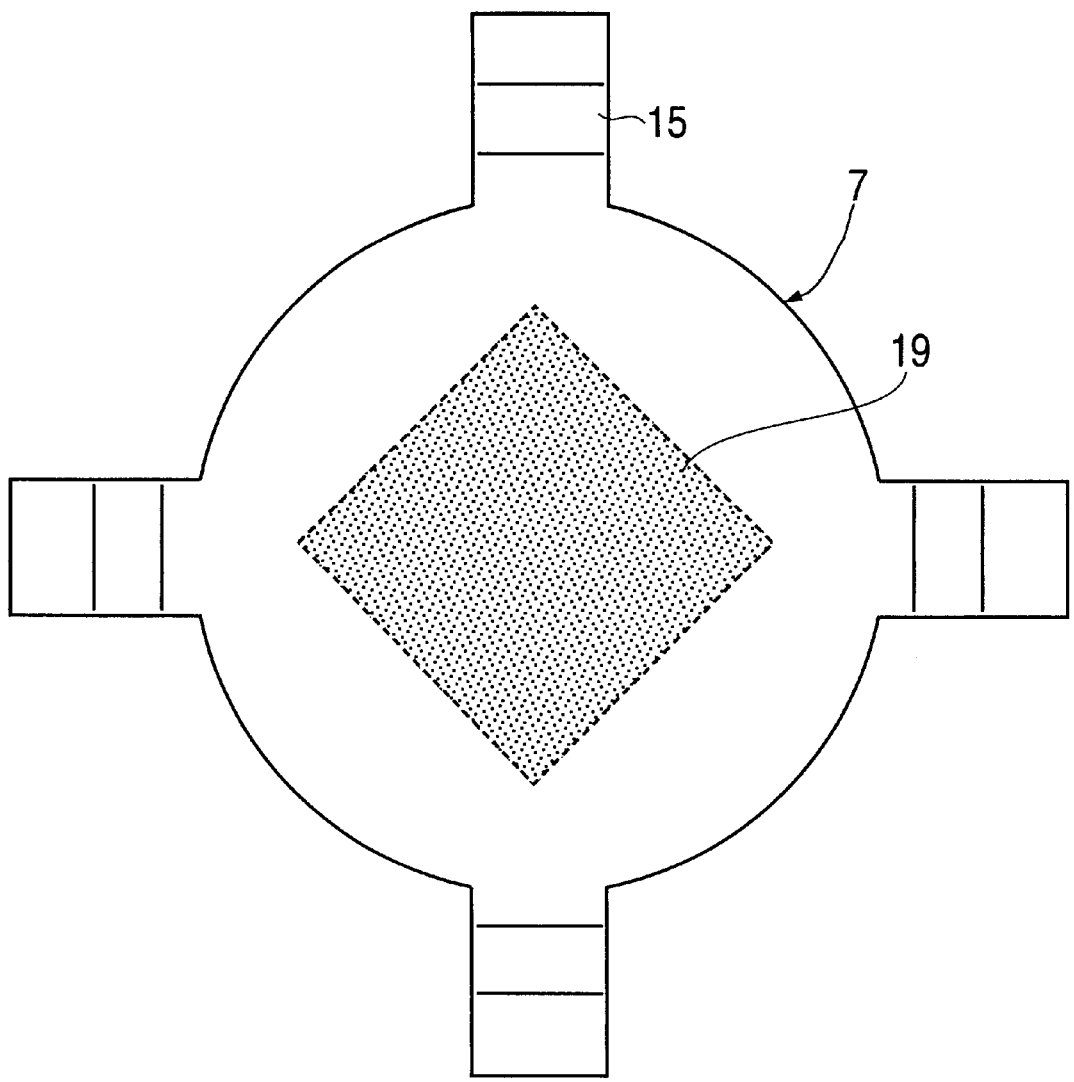
FIG. 8A is a view of the upper surface of the heat dispersion plate shown in FIGS. 7A and 7B.
Figure 8B:
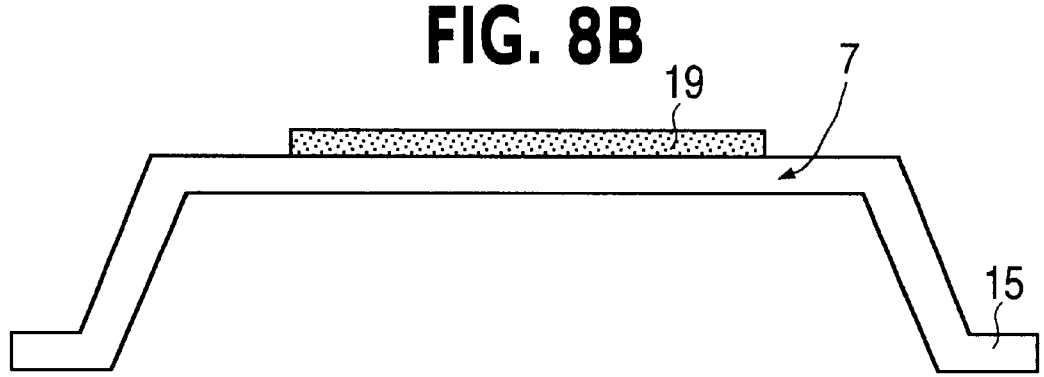
FIG. 8B is a vertical section of the heat dispersion plate.

As shown in FIGS. 8A and 8B, legs 15 of heat dispersion plate 7 are formed by bending tabs provided on a thin plate 0.1–0.2 mm thick that is circular or square in shape and composed of copper alloy or 42 alloy(Cu-42%Zn). The tips of legs 15 are processed so as to be parallel with respect to the installation surface of heat dispersion plate 7.

Thermoplastic resin 19 composed of a polyimide resin is coated to a thickness of 0.05–0.2 mm in at least the area in which island 2 and heat dispersion plate 7 overlap (indicated by the dotted lines in FIG. 8A). Alternatively, a three-layer tape 0.07–0.2 mm thick, in which a thermoplastic resin composed of a polyimide resin is coated onto both sides of a base film that is 0.05–0.1 mm thick and composed of a nonthermoplastic polyimide, is cut to a prescribed size and applied to the above-described area. The softening temperature of the thermoplastic resin used in this invention must be lower than the die temperature when forming resin-molded portion 8. For example, the softening temperature of the thermoplastic resin is preferably 150–160° C. if the die temperature is 160–190° C.

Explanation is next presented with reference to FIGS. 9A–9D regarding the fabrication method of the semiconductor package of this embodiment.

The operator prepares in advance heat dispersion plate 7 that has been processed as described hereinabove and a leadframe 24 for which the bonding process has been completed. As shown in FIG. 9A, the operator then places heat dispersion plate 7 in a cavity 13 of a lower die 11 of an upper and a lower die that have been heated to a desired temperature (for example, 160°–190° C.). At this time, the position of heat dispersion plate 7 is controlled by an inner walls 13a of cavity 13 such that heat dispersion plate 7 does not shift on the bottom surface of cavity 13. In this case, the clearance between the tips of legs 15 of heat dispersion plate 7 and inner walls 13a of cavity 13 is preferably on the order of 0.2–0.5 mm. A resin tablet 14 is then introduced into a transfer pot 25 after this positioning of heat dispersion plate 7.

The operator next places leadframe 24 on lower die 11 as shown in FIG. 9B. Island 2 and heat dispersion plate 7 are bonded together at this time because a thermoplastic resin 19 is softened by the heat of lower die 11 when thermoplastic resin 19 coated or applied onto heat dispersion plate 7 comes into contact with island 2.

The operator then raises lower die 11 as shown in FIG. 9C and closes lower die 11 and an upper die 10 to enclose leadframe 24 by lower die 11 and upper die 10. After closing the dies, the closed state of the dies is maintained for a prescribed time (for example, 3–8 seconds) to soften a resin tablet 14 by the heat of lower die 11.

After resin tablet 14 has been softened by the heat of lower die 11, a tablet pressure plunger (omitted in the figures) rises to press the softened resin into cavities 12 and 13 as shown in FIG. 9D and form resin-molded portion 8. At this time, the softened resin applies pressure to island 2 and heat dispersion plate 7 as it flows, thereby strengthening the bond between island 2 and heat dispersion plate 7.

The closed state of the dies is then maintained until the resin hardens (approximately 50–90 seconds). After the resin has hardened, lower die 11 drops, and an eject pin (omitted in the figures) protrudes to remove a resin-encapsulated leadframe 24 from the dies.

As described hereinabove, the semiconductor package of this embodiment is constructed as one package by simultaneously resin-encapsulating separately constructed leadframe unit 27 and heat dispersion plate 7. Heat dispersion plate 7 and island 2 are then bonded together by thermoplastic resin 19 that has been coated or applied onto heat dispersion plate 7.

Third Embodiment

Figure 10A:
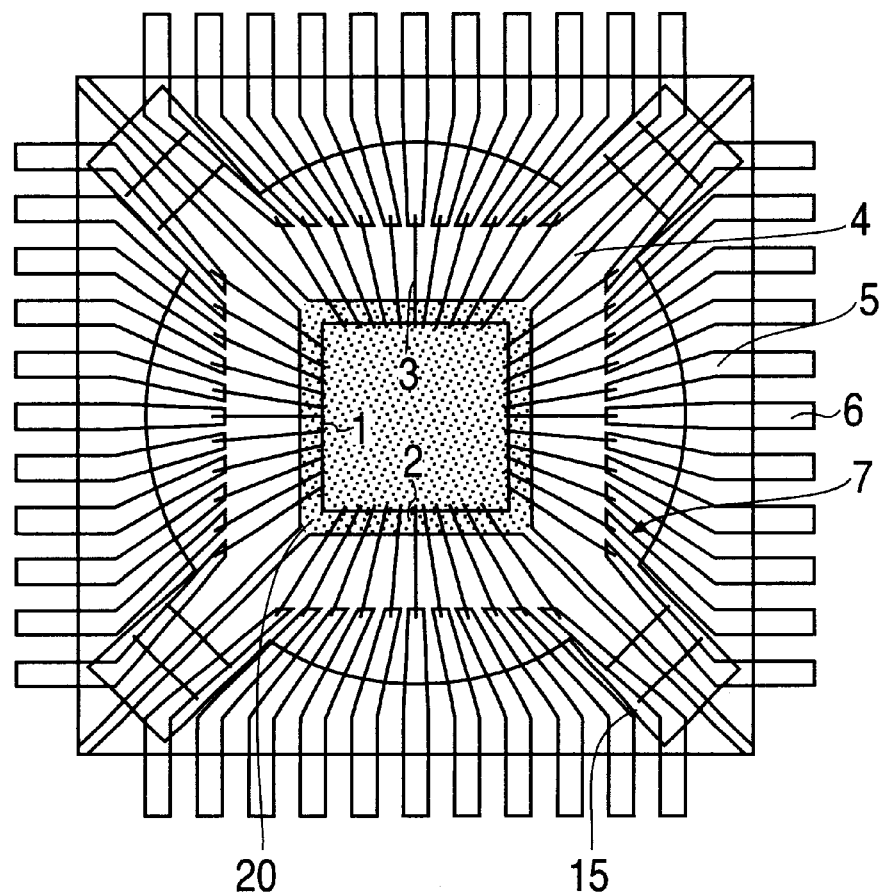
FIG. 10A is a see-through plan view showing the structure of the semiconductor package according to the third embodiment of the present invention.
Figure 10B:
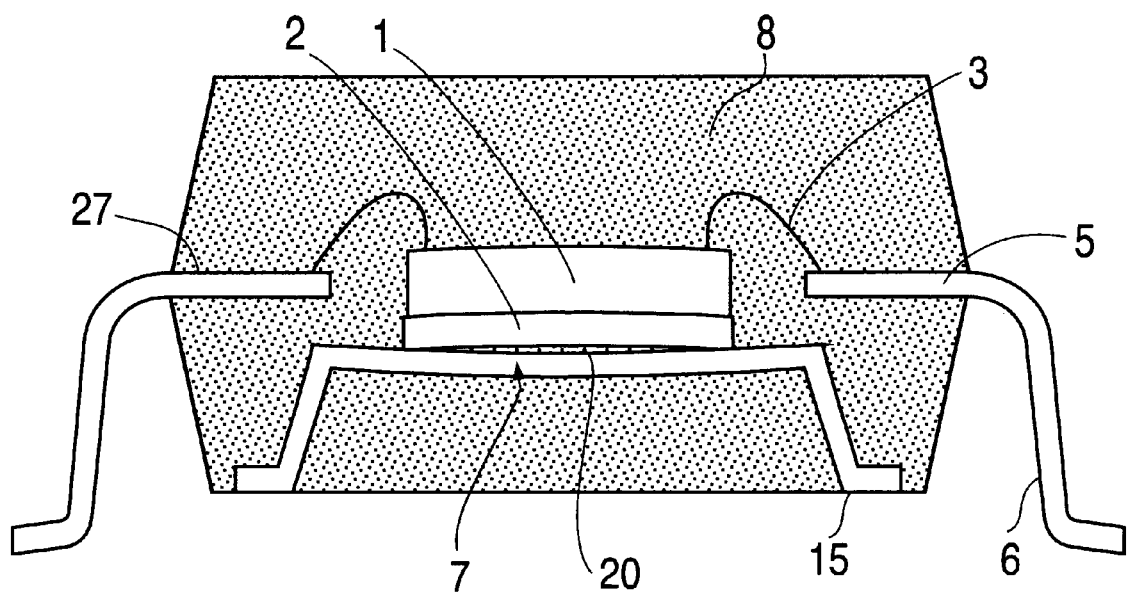
FIG. 10B is a vertical section of the semiconductor package.

Referring to FIGS. 10A and 10B, the semiconductor package according to this embodiment has a construction in which leadframe unit 27 is layered on heat dispersion plate 7 as in the prior art. In this embodiment, however, island 2 and heat dispersion plate 7 are bonded together by coating or applying a thermosetting resin 20 to heat dispersion plate 7. In other words, this embodiment replaces thermoplastic resin 19 used in the second embodiment with thermosetting resin 20.

Otherwise, the construction of leadframe unit 27, the method of securing semiconductor element 1 to island 2, and the method of connecting inner leads 5 to the electrodes on semiconductor element 1 are all equivalent to the prior art.

Figure 11A:
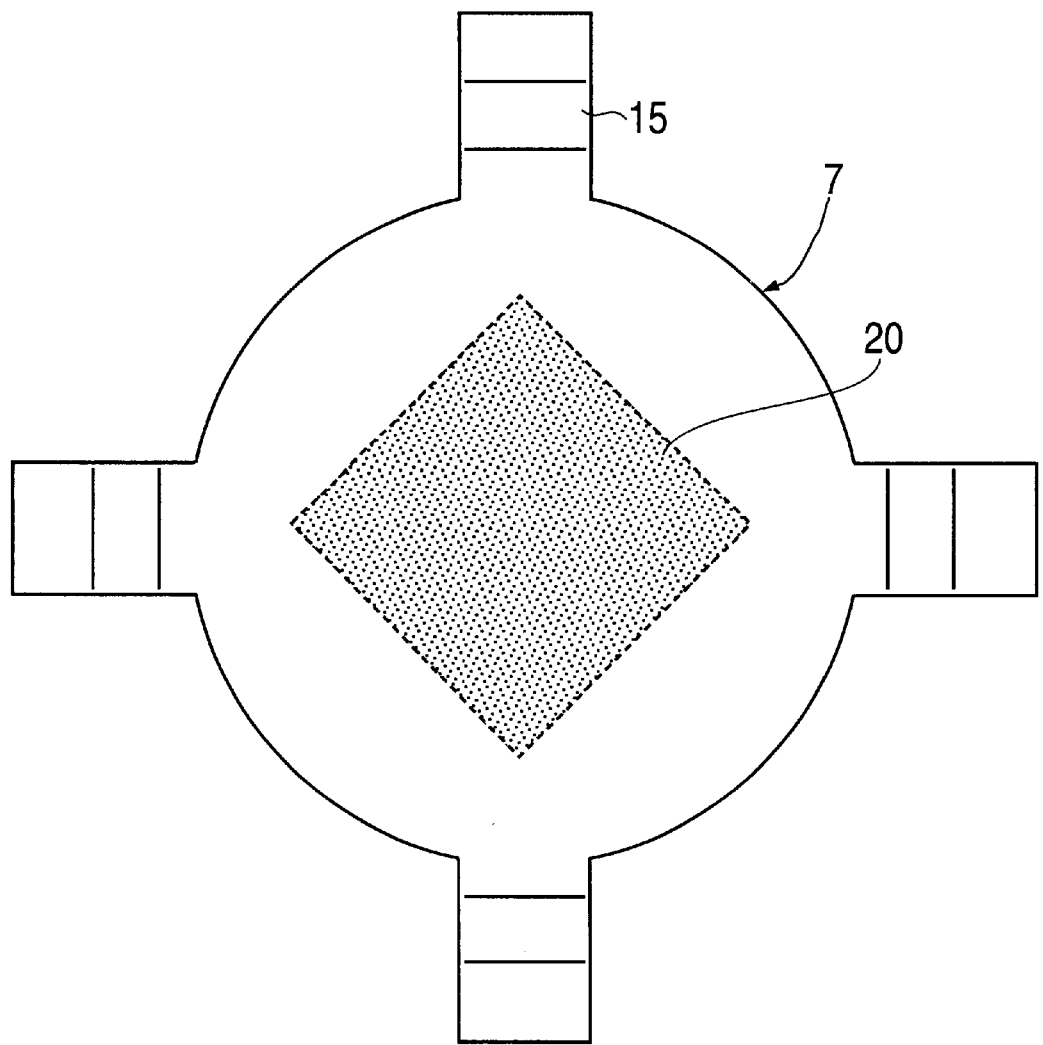
FIG. 11A shows the upper surface of the heat dispersion plate shown in FIGS. 10A and 10B.
Figure 11B:
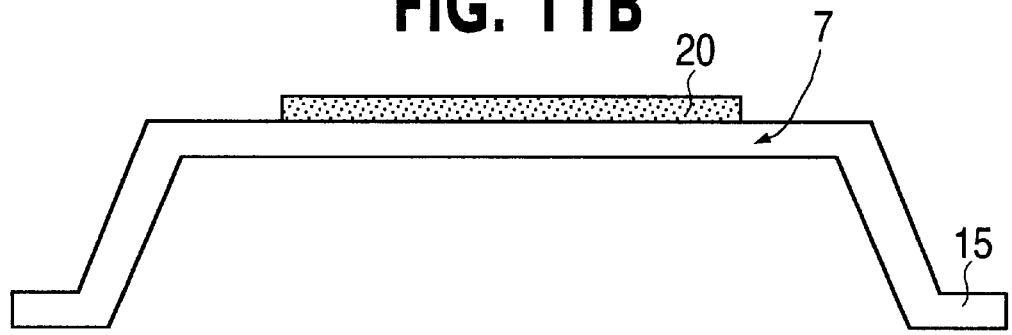
FIG. 11B is a vertical section of the heat dispersion plate.

As shown in FIGS. 11A and 11B, legs 15 of heat dispersion plate 7 are formed by bending tabs provided on a thin plate 0.1–0.2 mm thick that is circular or square in shape and composed of copper alloy or 42 alloy(Cu-42%Zn). The tips of legs 15 are processed so as to be parallel with respect to the installation surface of heat dispersion plate 7.

Thermosetting resin 20 composed of a NBR and a phenolic compound is coated to a thickness of 0.05–0.2 mm in at least the area in which island 2 and heat dispersion plate 7 overlap (indicated by the dotted lines in FIG. 11A). Alternatively, a three-layer tape 0.07–0.2 mm thick, in which a thermosetting resin composed of a NBR and a phenolic compound is coated onto both sides of a base film that is 0.05–0.1 mm thick and composed of a nonthermoplastic polyimide, is cut to a prescribed size and applied to the above-described area. The reaction temperature of the thermosetting resin used in this invention must be lower than the die temperature when forming resin-molded portion 8. For example, the reaction temperature of the thermosetting resin is preferably 150–160° C. if the die temperature is 160–190° C.

Explanation is next presented with reference to FIGS. 12A–12D regarding the fabrication method of the semiconductor package of this embodiment.

The operator prepares in advance heat dispersion plate 7 that has been processed as described hereinabove and a leadframe 24 for which the bonding process has been completed. As shown in FIG. 12A, the operator then places heat dispersion plate 7 in a cavity 13 of a lower die 11 of an upper and a lower die that have been heated to a desired temperature (for example, 160–190° C.). At this time, the position of heat dispersion plate 7 is controlled by an inner walls 13a of cavity 13 such that heat dispersion plate 7 does not shift on the bottom surface of cavity 13. In this case, the clearance between the tips of legs 15 of heat dispersion plate 7 and inner walls 13a of cavity 13 is preferably on the order of 0.2–0.5 mm. After this positioning of heat dispersion plate 7, a resin tablet 14 is introduced into a transfer pot 25.

The operator next places leadframe 24 on lower die 11 as shown in FIG. 12B. Island 2 and heat dispersion plate 7 are bonded together at this time because thermosetting resin 20 begins to harden due to the heat of lower die 11 when thermosetting resin 20 coated or applied onto heat dispersion plate 7 comes into contact with island 2.

The operator then raises lower die 11 as shown in FIG. 12C and closes lower die 11 and an upper die 10 to enclose leadframe 24 by lower die 11 and upper die 10. After closing the dies, the closed state of the dies is maintained for a prescribed time (for example, 3–8 seconds) to soften a resin tablet 14 by the heat of lower die 11. The reaction of thermosetting resin 20 proceeds at this time and generates outgas, but outgas generated during hardening of thermosetting resin 20 is eliminated by vacuum-evacuation of the interior of the die cavities.

After resin tablet 14 has been softened by the heat of lower die 11, a tablet pressure plunger (omitted in the figures) rises to press the softened resin into cavities 12 and 13 as shown in FIG. 12D and form resin-molded portion 8. At this time, the softened resin applies pressure to island 2 and heat dispersion plate 7 as it flows, thereby strengthening the bond between island 2 and heat dispersion plate 7.

The closed state of the dies is then maintained until the resin hardens (approximately 50–90 seconds). After the resin has hardened, lower die 11 drops, and an eject pin (omitted in the figures) protrudes to remove a resin-encapsulated leadframe 24 from the dies.

As described hereinabove, the semiconductor package of this embodiment is constructed as one package by simultaneously resin-encapsulating separately constructed leadframe unit 27 and heat dispersion plate 7. Heat dispersion plate 7 and island 2 are then bonded together by thermosetting resin 20 that has been coated or applied onto heat dispersion plate 7.

Fourth Embodiment

Figure 13A:
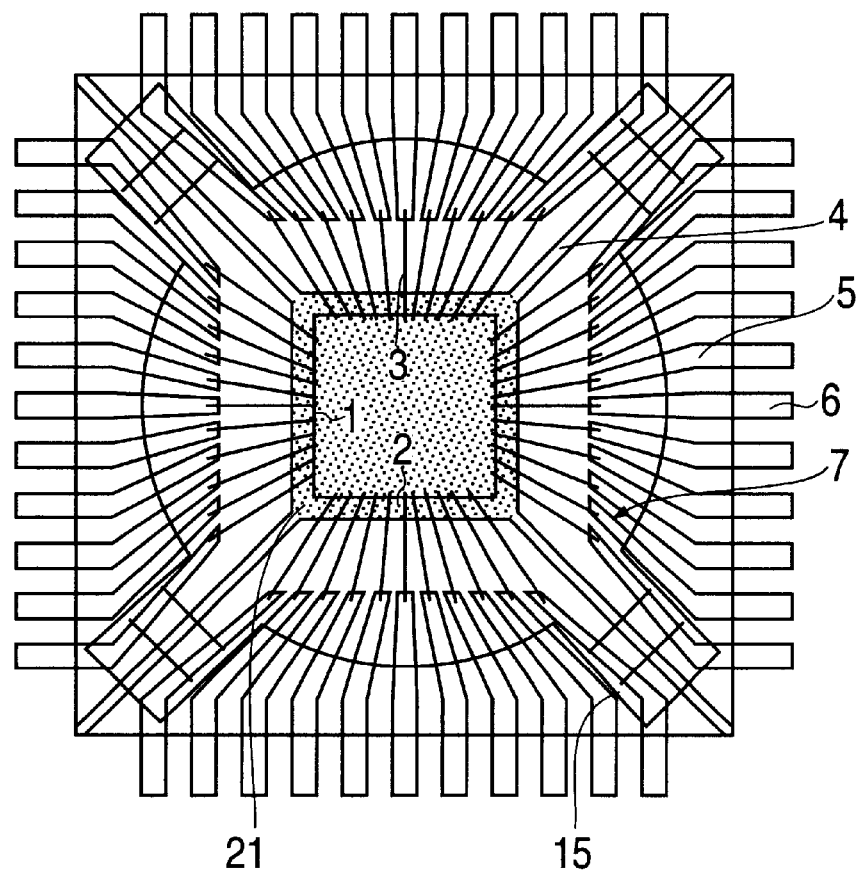
FIG. 13A is a see-through plan view showing the structure of the semiconductor package according to the fourth embodiment of the present invention.
Figure 13B:
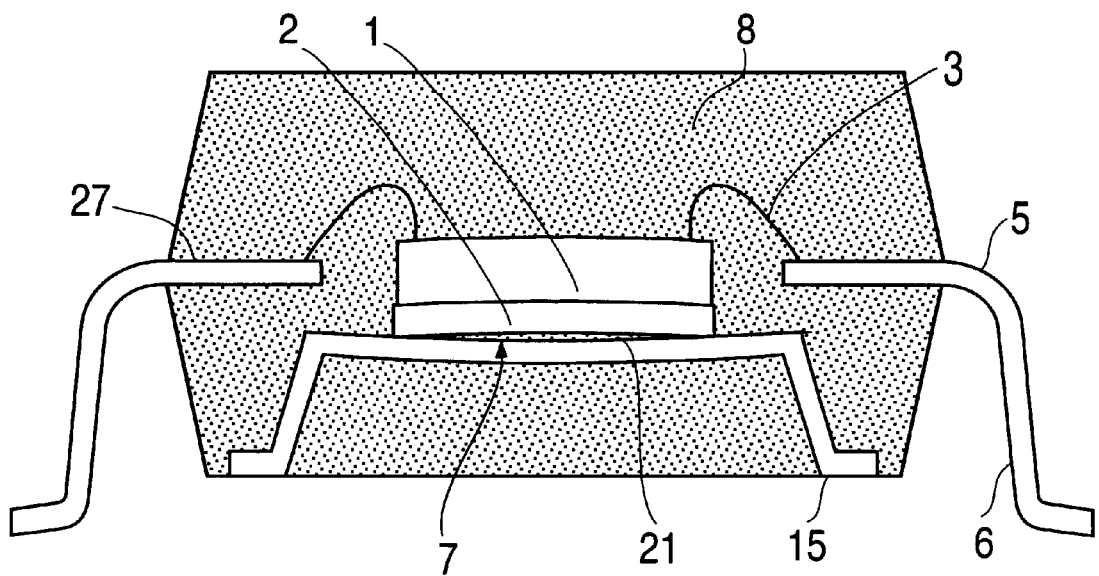
FIG. 13B is a vertical section of the semiconductor package.

Referring to FIGS. 13A and 13B, the semiconductor package according to this embodiment has a construction in which leadframe unit 27 is layered on heat dispersion plate 7 as in the prior art. In this embodiment, however, island 2 and heat dispersion plate 7 are soldered together by coating or plating a low-melting metal 21 to heat dispersion plate 7. In other words, this embodiment replaces thermoplastic resin 19 used in the second embodiment with low-melting metal 21. Otherwise, the construction of leadframe unit 27, the method of securing semiconductor element 1 to island 2, and the method of connecting inner leads 5 to the electrodes on semiconductor element 1 are all equivalent to the prior art.

Figure 14A:
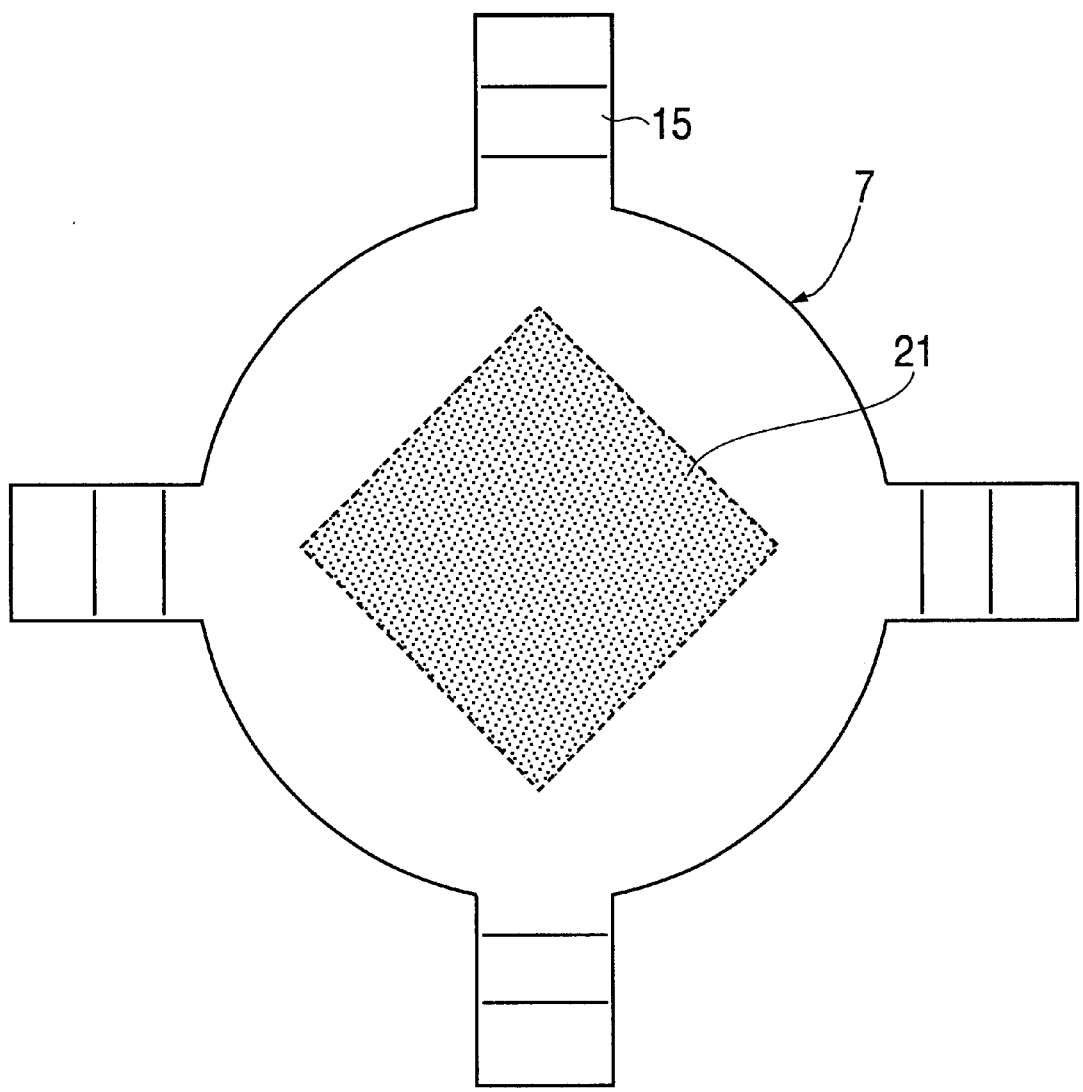
FIG. 14A shows the upper surface of the heat dispersion plate shown in FIGS. 13A and 13B.
Figure 14B:
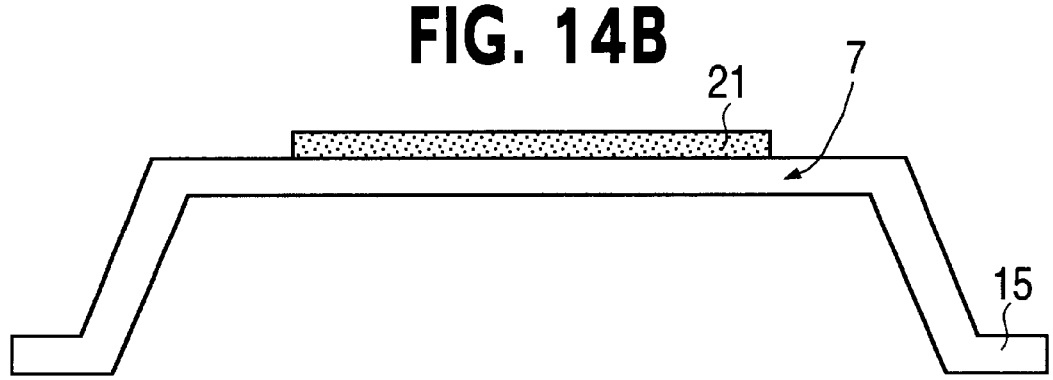
FIG. 14B is a vertical section of the heat dispersion plate.

As shown in FIGS. 14A and 14B, legs 15 of heat dispersion plate 7 are formed by bending tabs provided on a thin plate 0.1–0.2 mm thick that is circular or square in shape and composed of copper alloy or 42 alloy(Cu-42%Zn). The tips of legs 15 are processed so as to be parallel with respect to the installation surface of heat dispersion plate 7.

Low-melting metal 21 composed of an alloy of tin and bismuth is coated or plated to a thickness of 0.05–0.2 mm in at least the area of heat dispersion plate 7 in which island 2 and heat dispersion plate 7 overlap (indicated by the dotted lines in FIG. 14A). As methods of coating a low-melting metal, a solder paste method may be employed, or a method may be adopted in which a thin film of a low-melting metal is cut to a prescribed size, placed on the above-described area, and then melted by heating. The melting point of the low-melting metal used in this invention must be lower than the die temperature when forming resin-molded portion 8. For example, the melting point of the low-melting metal is preferably 150 –160° C. if the die temperature is 160–190° C.

Explanation is next presented with reference to FIGS. 15A–15D regarding the fabrication method of the semiconductor package of this embodiment.

The operator prepares in advance heat dispersion plate 7 that has been processed as described hereinabove and a leadframe 24 for which the bonding process has been completed. As shown in FIG. 15A, the operator then places heat dispersion plate 7 in a cavity 13 of a lower die 11 of an upper and a lower die that have been heated to a desired temperature (for example, 160–190° C.). At this time, the position of heat dispersion plate 7 is controlled by an inner walls 13a of cavity 13 such that heat dispersion plate 7 does not shift on the bottom surface of cavity 13. In this case, the clearance between the tips of legs 15 of heat dispersion plate 7 and inner walls 13a of cavity 13 is preferably on the order of 0.2–0.5 mm. A resin tablet 14 is then introduced into a transfer pot 25 after the positioning of heat dispersion plate 7.

The operator next places leadframe 24 on lower die 11 as shown in FIG. 15B. Island 2 and heat dispersion plate 7 are bonded together at this time because a low-melting metal 21 melts due to the heat of lower die 11 when the low-melting metal 21 coated or plated onto heat dispersion plate 7 comes into contact with island 2.

The operator then raises lower die 11 and closes lower die 11 and an upper die 10 to enclose leadframe 24 by lower die 11 and upper die 10 as shown in FIG. 15C. After closing the dies, the closed state of the dies is maintained for a prescribed time (for example, 3–8 seconds) to soften a resin tablet 14 by the heat of lower die 11.

After resin tablet 14 has been softened by the heat of lower die 11, a tablet pressure plunger (omitted in the figures) rises to press the softened resin into cavities 12 and 13 as shown in FIG. 15D and form resin-molded portion 8.

The closed state of the dies is then maintained until the resin hardens (approximately 50–90 seconds). After the resin has hardened, lower die 11 drops, and an eject pin (omitted in the figures) protrudes to remove an resin-encapsulated leadframe 24 from the dies.

As described hereinabove, the semiconductor package of this embodiment is constructed as one package by simultaneously resin-encapsulating separately constructed leadframe unit 27 and heat dispersion plate 7. Heat dispersion plate 7 and island 2 are then soldered together by low-melting metal 21 that has been coated or plated onto heat dispersion plate 7.

Fifth Embodiment

Figure 16A:
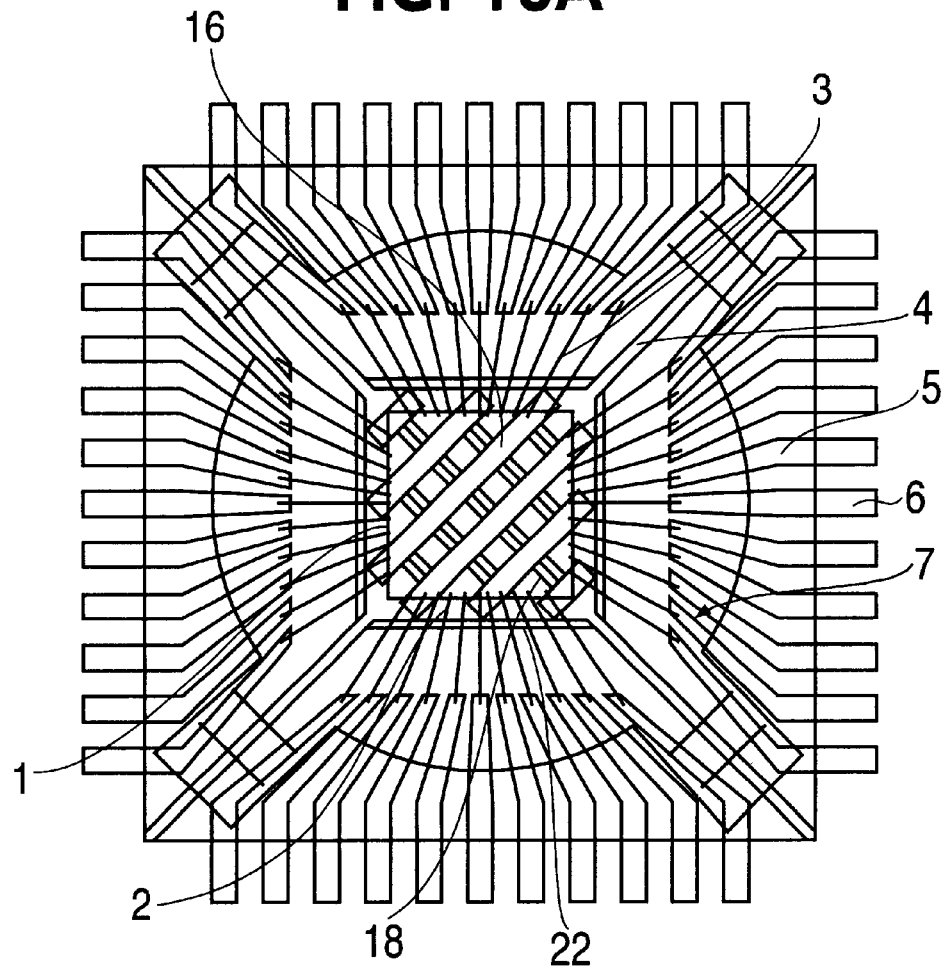
FIG. 16A is a see-through plan view showing the structure of the semiconductor package according to the fifth embodiment of the present invention.
Figure 16B:
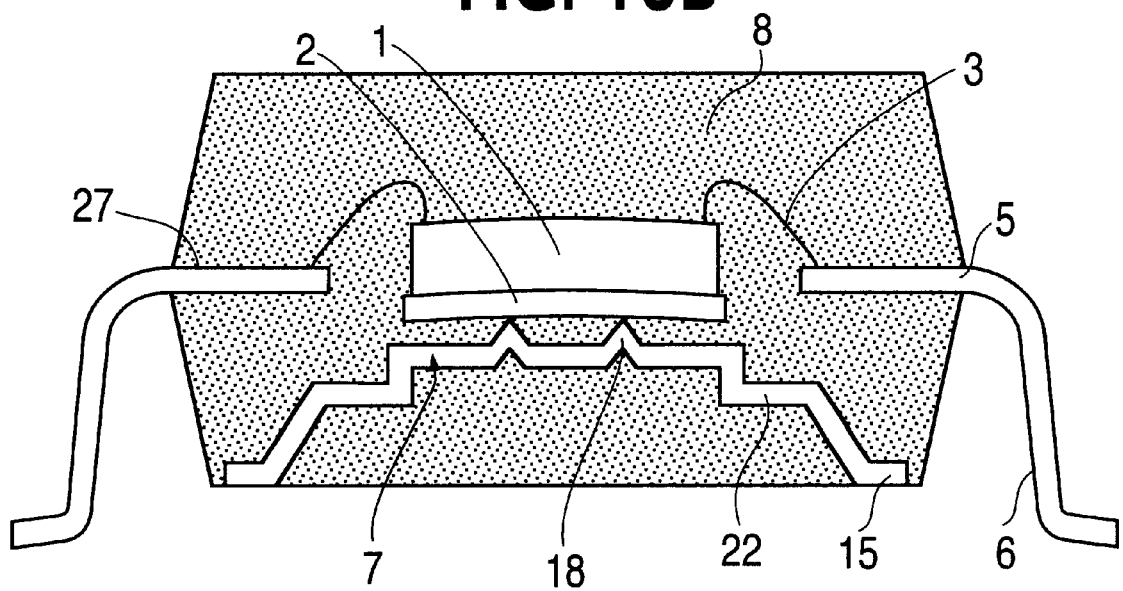
FIG. 16B is a vertical section showing the semiconductor package.

Referring to FIGS. 16A and 16B, the semiconductor package according to this embodiment has a construction in which leadframe unit 27 is layered on heat dispersion plate 7 as in the prior art. In this embodiment, however, island 2 is supported by bumps 18 formed on heat dispersion plate 7. A gap is thus formed by bumps 18 between island 2 and heat dispersion plate 7, and island 2 and heat dispersion plate 7 are bonded together by filling this gap by the resin that forms resin-molded portion 8. In addition, the area outside at least the area of heat dispersion plate 7 in which island 2 and heat dispersion plate 7 overlap is a down-offset portion 22 that is offset away from the inner lead formation surface. Otherwise, the construction of leadframe unit 27, the method of securing semiconductor element 1 to island 2, and the method of connecting inner leads 5 to the electrodes on semiconductor element 1 are all equivalent to the prior art.

Legs 15 of heat dispersion plate 7 are formed by bending tabs provided on a thin plate 0.1–0.2 mm thick that is circular or square in shape and composed of copper alloy or 42 alloy(Cu-42%Zn). The tips of legs 15 are processed so as to be parallel with respect to the installation surface of heat dispersion plate 7. The under surfaces of the tips of legs 15 are exposed on the reverse surface of resin-molded portion 8 on the bottom surface of the package after resin molding, as shown in FIG. 16B.

Figure 17A:
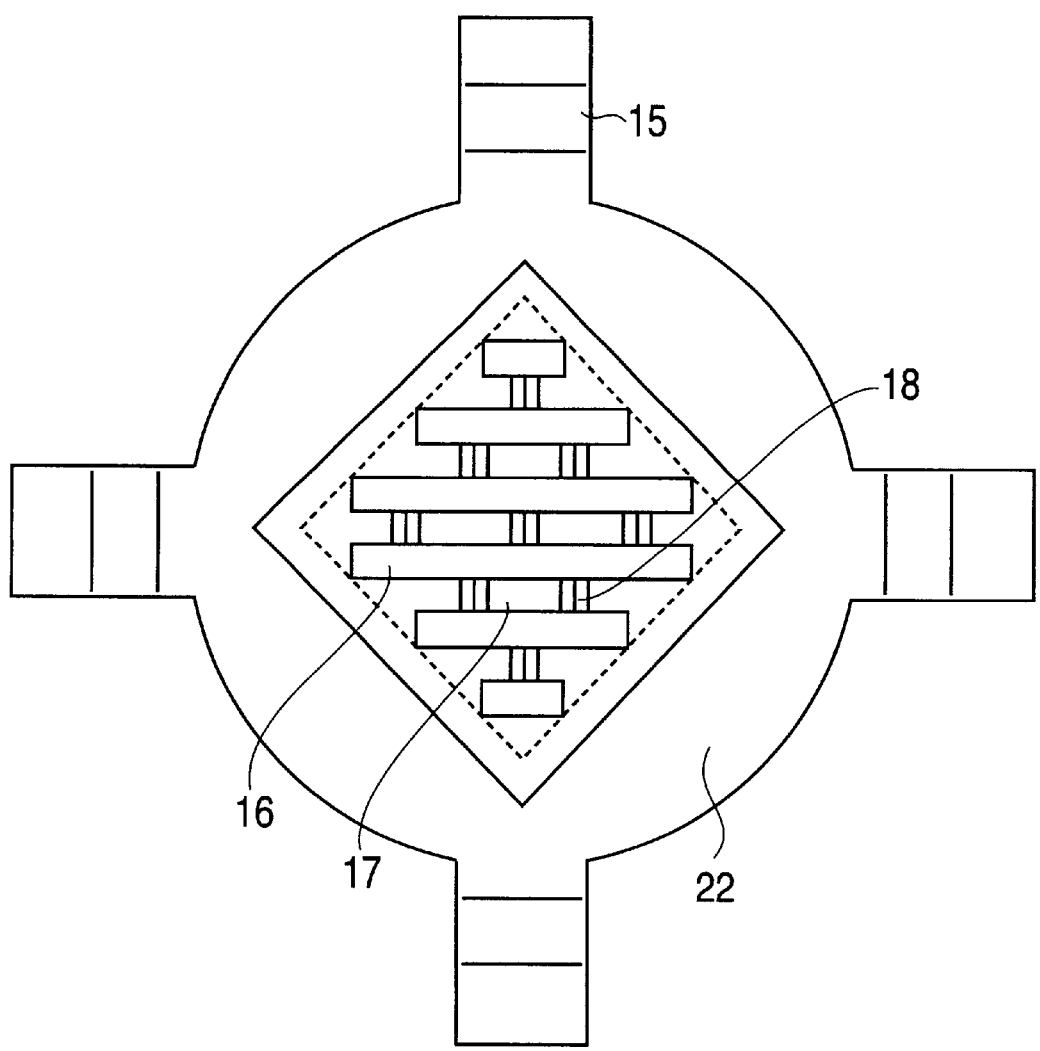
FIG. 17A shows the upper surface of the heat dispersion plate shown in FIGS. 16A and 16B.
Figure 17B:
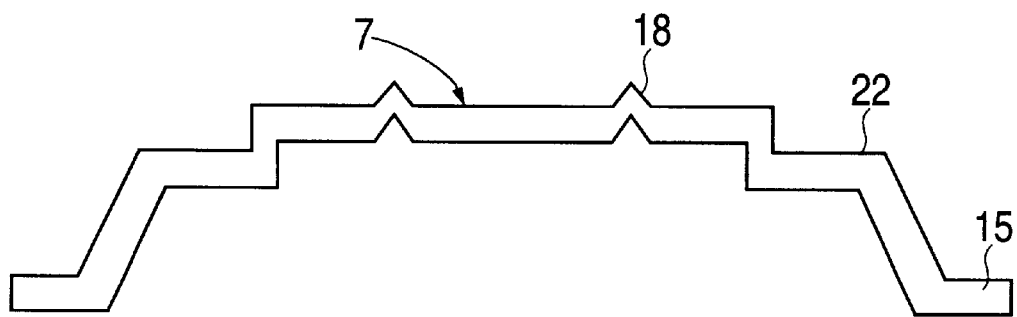
FIG. 17B is a vertical section of the heat dispersion plate.

In addition, slits 16 for resin flow are provided in heat dispersion plate 7 in at least the area of overlap with island 2 (indicated by dotted lines in FIG. 17A), and bumps 18 are formed by bending frames 17 between slits 16. Ample spacing is maintained between heat dispersion plate 7 and inner leads 5 because the area beyond at least the area in which island 2 and heat dispersion plate 7 overlap is made a down-offset portion 22 by a press process. The amount of down-offset in this case varies with the amount of dimpling of the heat dispersion plate, but is preferably set to approximately, for example, 0–0.5 mm, and the spacing between inner leads 5 and heat dispersion plate 7 is preferably set to approximately 0.5 mm.

Explanation is next presented with reference to FIGS. 18A–18D regarding the fabrication method of the semiconductor package of this embodiment. The description is simplified here because the production flow is the same as that for the first embodiment.

Figure 18A:
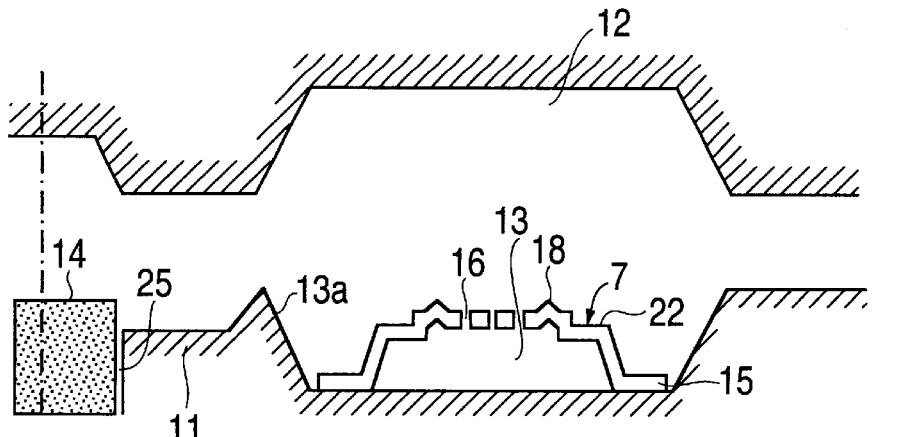
FIGS. 18A–18D show the resin molding processes of the semiconductor package shown in FIGS. 16A and 16B.

First, as shown in FIG. 18A, the operator places heat dispersion plate 7 in a cavity 13 of a lower die 11 of an upper and a lower die that have been heated to a desired temperature. The operator then inserts a resin tablet 14 inside a transfer pot 25.

Figure 18B:
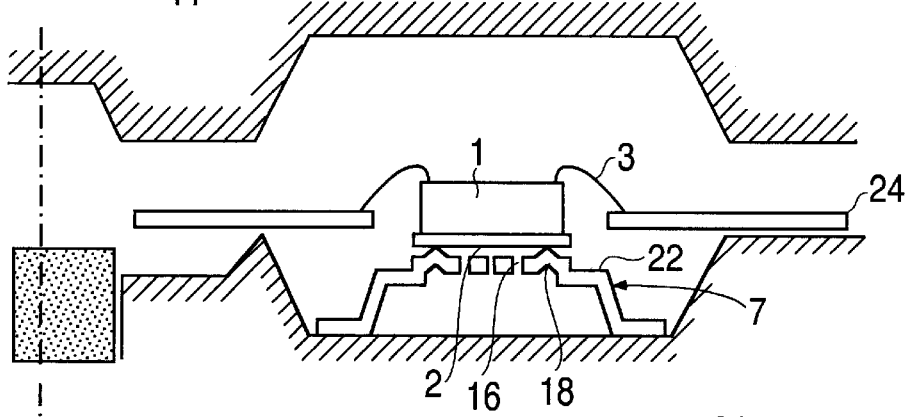

The operator next places leadframe 24 to which bonding wires 3 have been applied onto lower die 11 as shown in FIG. 18B. At this time, bumps 18 on heat dispersion plate 7 come into contact with island 2 to form a gap between heat dispersion plate 7 and island 2.

Figure 18C:
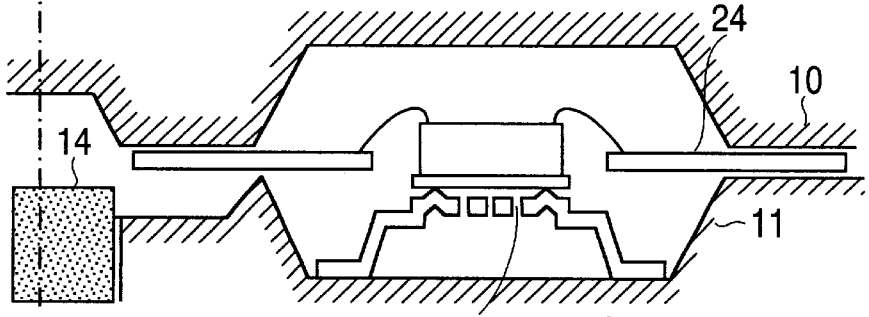

The operator then closes lower die 11 and upper die 10 such that leadframe 24 is enclosed between lower die 11 and upper die 10 as shown in FIG. 18C. After closure, the closed state of the dies is maintained for a prescribed interval of time.

Figure 18D:
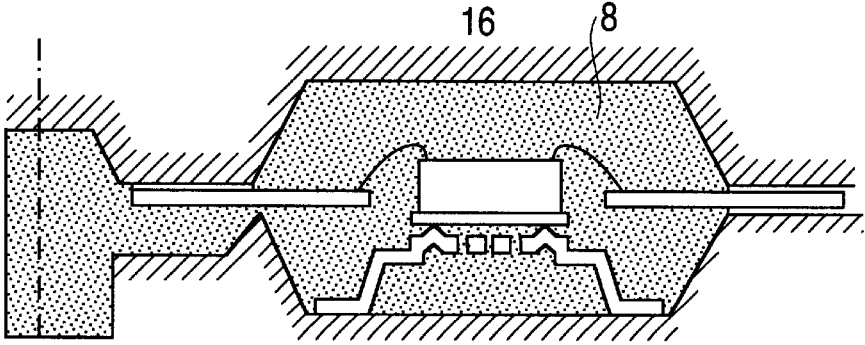

After resin tablet 14 has been softened by the heat of lower die 11, the softened resin is pressed into cavities 12 and 13 by a plunger (omitted in the figures) to form resin-molded portion 8 as shown in FIG. 18D. At this time, the softened resin passes through slits 16 formed in heat dispersion plate 7 and fills the gap formed by bumps 18 between heat dispersion plate 7 and island 2.

The closed state of the dies is then maintained until the resin has completed hardening. After the resin has hardened, lower die 11 drops, and a resin-encapsulated leadframe 24 is removed from the dies.

As described hereinabove, the semiconductor package of this embodiment is constructed as one package by simultaneously resin-encapsulating separately constructed leadframe unit 27 and heat dispersion plate 7. The resin that forms resin-molded portion 8 fills the gap formed by bumps 18 between heat dispersion plate 7 and island 2 by way of slits 16, and the filling of this gap bonds together heat dispersion plate 7 and island 2. Moreover, at least the area of heat dispersion plate 7 beyond the area in which heat dispersion plate 7 and island 2 overlap is made a down-offset portion 22 that is offset away from the inner lead formation surface, whereby ample spacing can be maintained between heat dispersion plate 7 and inner leads 5.

Table 3 shows the differences in the rate of incidence of shorts between a semiconductor package of the prior art and the semiconductor package of this embodiment. As can be seen from the table, the incidence of shorts after formation of resin-molded portion 8 can be prevented.

TABLE 3

|  | Prior art | Present invention |
| --- | --- | --- |
| Distance between inner leads and heat dispersion plate after resin molding | 38 (μm) (mean value) | 286 (μm) (mean value) |
| Rate of incidence of shorts between inner leads and heat dispersion plate after resin molding | 3/100 (3%) | 0/100 (0.0%) |

Although the method of the first embodiment was adopted for bonding together heat dispersion plate 7 and island 2 in the semiconductor package of this embodiment, the invention is not limited to this method, and any of the methods of bonding together heat dispersion plate 7 and island 2 described in the first to fourth embodiments may be applied in the package that includes a down-offset portion 22 according to this embodiment. Accordingly, if the method of the second embodiment is applied, for example, a package modification can be provided in which a down-offset portion is formed in heat dispersion plate 7 in the package shown in FIGS. 7A and 7B.

Sixth Embodiment

Figure 19A:
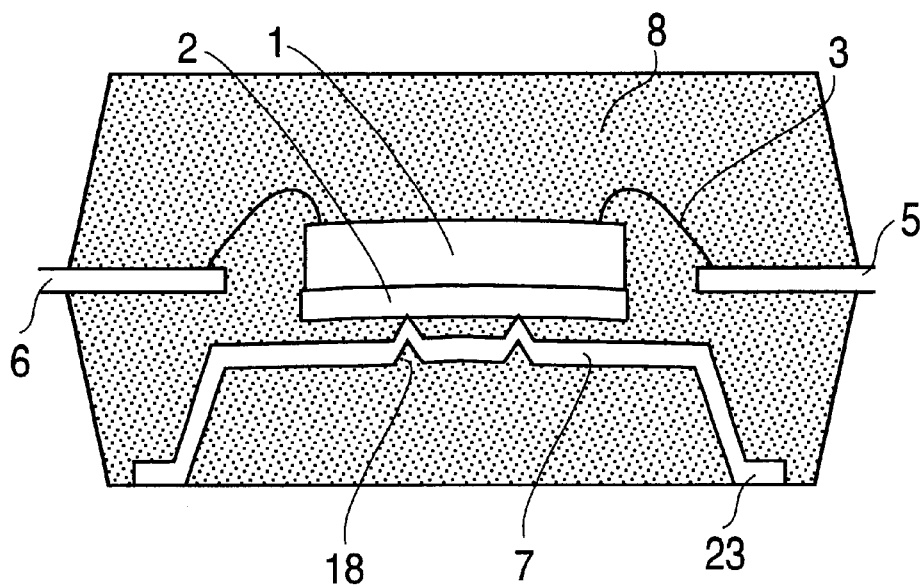
FIG. 19A is vertical section showing the structure of the semiconductor package according to the sixth embodiment of the present invention.
Figure 19B:
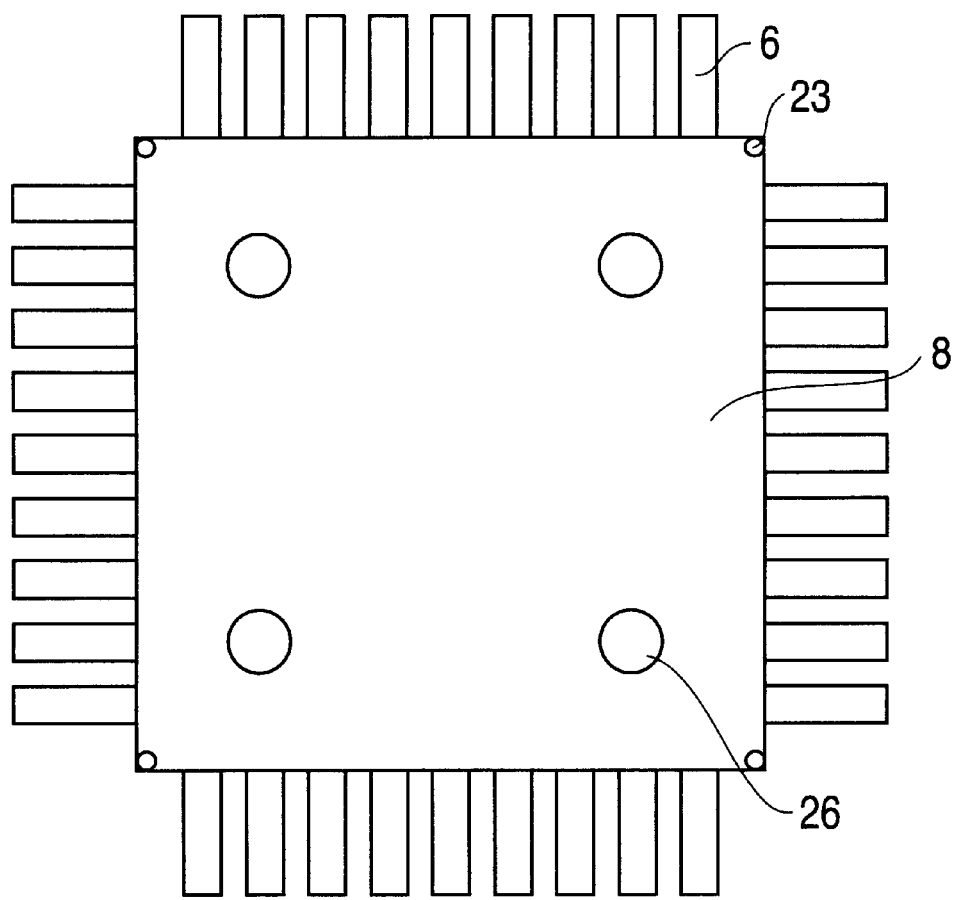
FIG. 19B is a plan view of the bottom surface of the semiconductor package.

Referring to FIGS. 19A and 19B, the semiconductor package according to this embodiment has a construction in which a leadframe unit is layered on heat dispersion plate 7 as in the prior art. In this embodiment, however, island 2 is supported by bumps 18 formed on heat dispersion plate 7. A gap is formed by bumps 18 between island 2 and heat dispersion plate 7, and island 2 and heat dispersion plate 7 are then bonded together by filling this gap by the resin that forms resin-molded portion 8. In addition, the tips of legs 23 of heat dispersion plate 7 are formed as acute angles, and the angle formed by the installation surface of heat dispersion plate 7 (the same surface as the reverse surface of the package) and the tips of legs 23 of heat dispersion plate 7 (θ in FIG. 21B) is greater than 0 degrees. Otherwise, the construction of leadframe unit 27, the method of securing semiconductor element 1 to island 2, and the method of connecting inner leads 5 to the electrodes on semiconductor element 1 are all equivalent to the prior art.

Figure 21A:
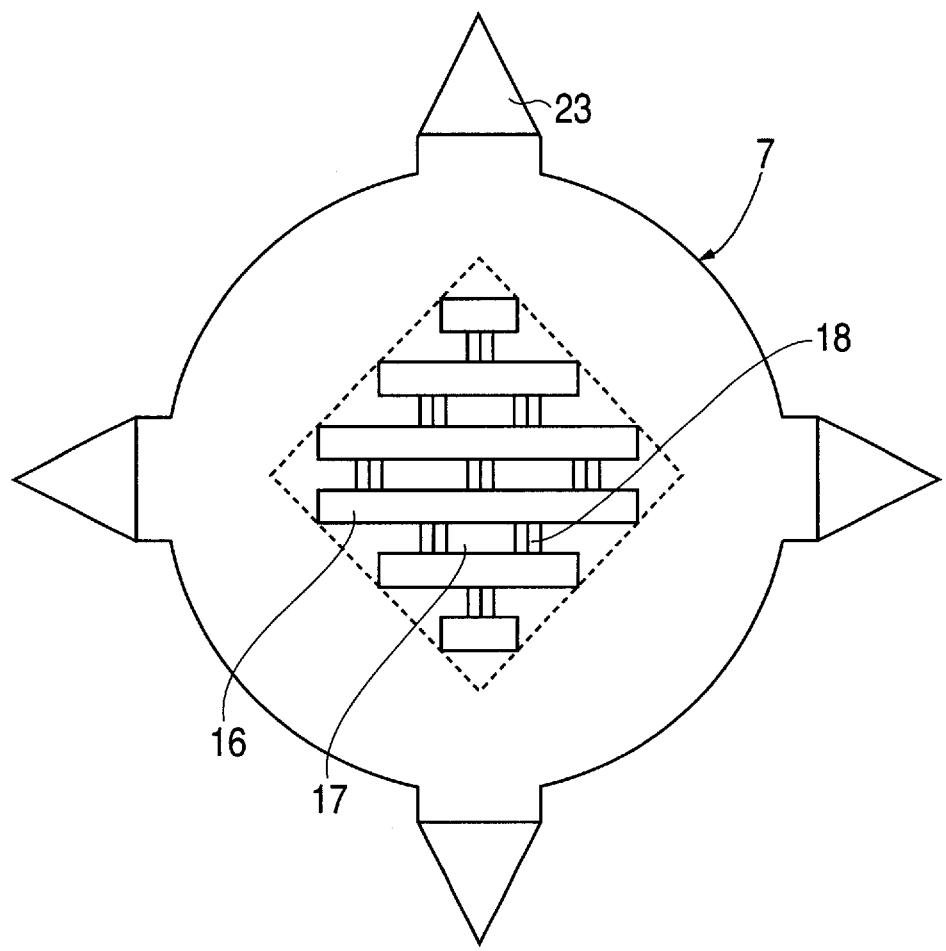
FIG. 21A shows the upper surface of the heat dispersion plate shown in FIGS. 19A and 19B.
Figure 21B:
FIG. 21B is a vertical section of the heat dispersion plate.

As shown in FIGS. 21A and 21B, legs 23 of heat dispersion plate 7 are formed by both pointing the end portions of tabs provided on a thin plate 0.1–0.2 mm thick that is circular or square in shape and composed of copper alloy or 42 alloy(Cu-42%Zn), and then bending the tabs. The pointed portions of the tips of legs 23 are exposed on the surface of resin-molded portion 8 on the bottom surface of the package after resin molding, as shown in FIG. 19B. In this case, the tips of legs 23 of heat dispersion plate 7 are formed as acute angles, and the angle formed by the installation surface of heat dispersion plate 7 and the tips of legs 23 of heat dispersion plate 7 (θ in FIG. 21B) is greater than 0 degrees. The exposed portions of the tips of legs 23 are therefore points, and the exposed surface area is therefore extremely small. No particular limit applies to the acute angle of the tips of legs 23 of heat dispersion plate 7 as long as the angle is less than 90°, but an angle on the order of 60° is preferable. No particular limit applies to the angle θ of the tips of legs 23 of heat dispersion plate 7 with respect to the installation surface as long as the angle is greater than 0° and less than or equal to 90°, but an angle of 45° is preferable.

Figure 20A:
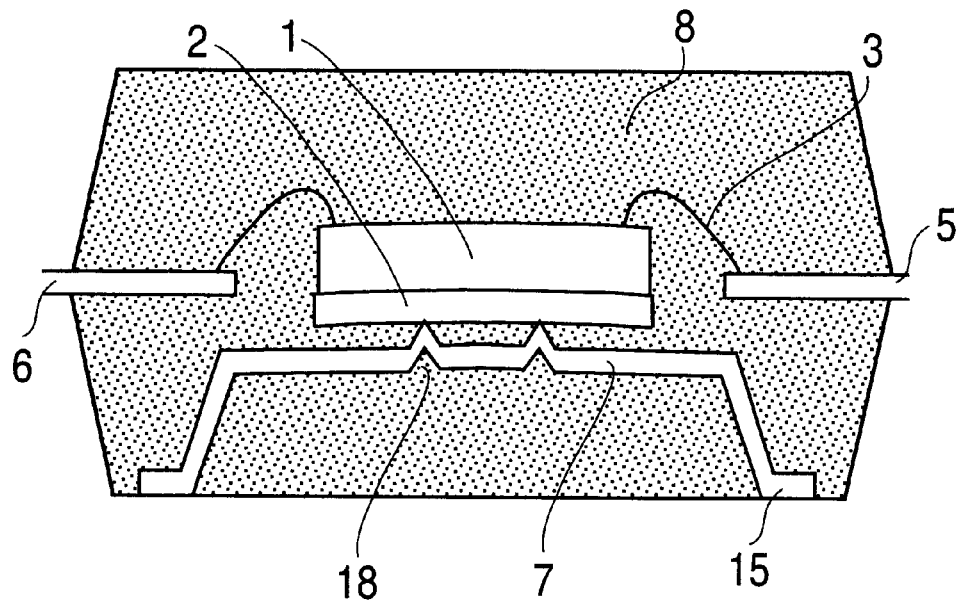
FIG. 20A is a vertical section showing the structure of the semiconductor package according to the first embodiment of the present invention.
Figure 20B:
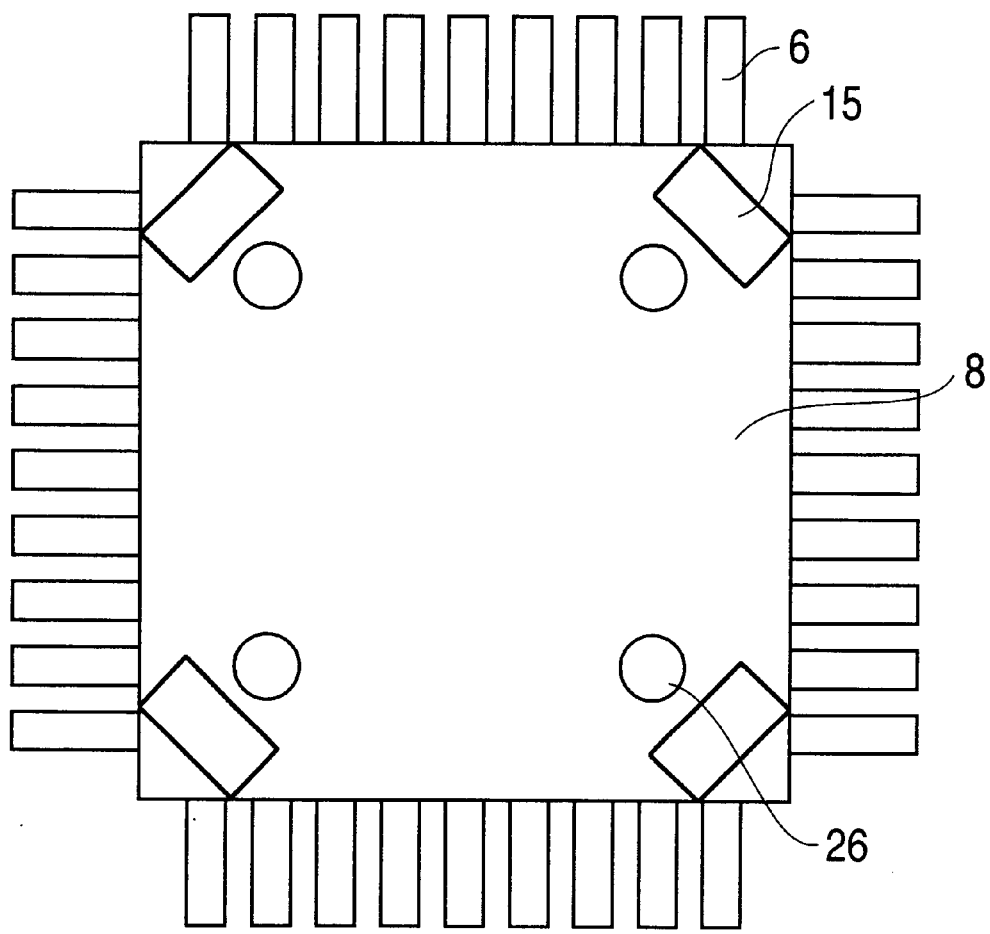
FIG. 20B is a plan view of the bottom surface of the semiconductor package.

In contrast, the tips of legs 15 of heat dispersion plate 7 contact the installation surface of heat dispersion plate 7 as flat surfaces in the case of the first embodiment, as shown in FIGS. 20A and 20B, and the exposed surface area of legs 15 of heat dispersion plate 7 is therefore quite large.

Explanation is next presented with reference to FIGS. 22A–22D regarding the fabrication method of the semiconductor package of this embodiment. The description is simplified here because the production flow is the same as that for the first embodiment.

Figure 22A:
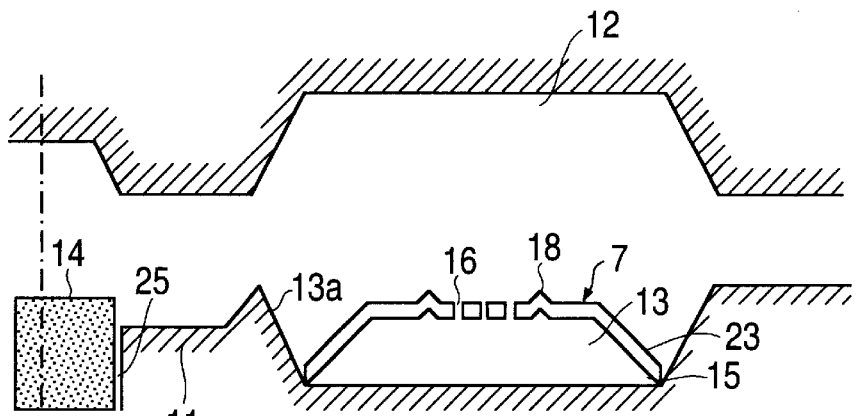
FIGS. 22A–22D show the resin molding processes of the semiconductor package shown in FIGS. 19A and 19B.

First, as shown in FIG. 22A, the operator places heat dispersion plate 7 in a cavity 13 of a lower die 11 of an upper and a lower die that have been heated to a desired temperature. The operator then introduces a resin tablet 14 inside a transfer pot 25.

Figure 22B:
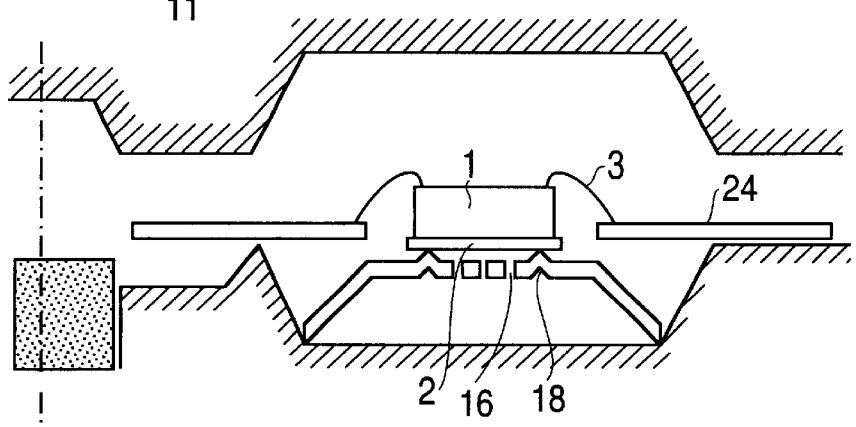

Next, as shown in FIG. 22B, the operator places a leadframe 24 to which bonding wires 3 have been applied onto lower die 11. At this time, bumps 18 on heat dispersion plate 7 come into contact with island 2 to form a gap between heat dispersion plate 7 and island 2.

Figure 22C:
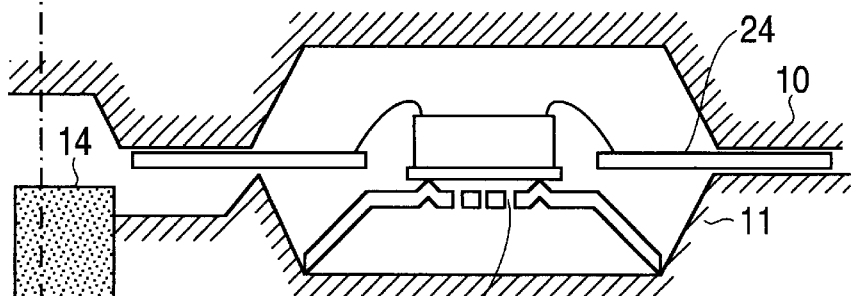

The operator then closes lower die 11 and an upper die 10 such that leadframe 24 is enclosed between lower die 11 and upper die 10 as shown in FIG. 22C. After closure, the closed state of the dies is maintained for a prescribed interval of time.

Figure 22D:
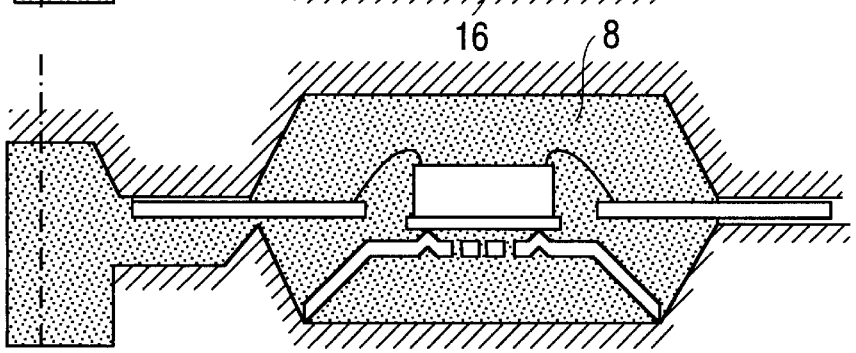

After resin tablet 14 has been softened by the heat of lower die 11, the softened resin is pressed into cavities 12 and 13 by a plunger (omitted in the figures) to form resin-molded portion 8 as shown in FIG. 22D. At this time, the softened resin passes through slits 16 formed in heat dispersion plate 7 and fills the gap formed by bumps 18 between heat dispersion plate 7 and island 2.

The closed state of the dies is then maintained until the resin has completed hardening. After the resin has hardened, lower die 11 drops, and a resin-encapsulated leadframe 24 is removed from the dies.

As described hereinabove, the semiconductor package of this embodiment is constructed as one package by simultaneously resin-encapsulating a separately constructed leadframe unit 27 and heat dispersion plate 7.

In addition, the tips of legs 23 of heat dispersion plate 7 are formed as acute angles, and the angle formed by the installation surface of heat dispersion plate 7 (the same surface as the reverse surface of the package) and the tips of legs 23 of heat dispersion plate 7 (θ in FIG. 21B) is greater than 0 degrees.

Table 4 shows the differences in the rate of peeling of resin from the leg portions of heat dispersion plates for a semiconductor package of the prior art and a semiconductor package of this embodiment. From this table, it can be seen that the present invention can prevent peeling of resin after a reflow process, thereby improving the moisture resistance of the package.

TABLE 4

|  | Prior art | Present invention |
| --- | --- | --- |
| Surface area of exposed tips of legs of heat dispersion plate (surface area per leg) | About 6.0 mm$^2$ | Less than 0.2 mm$^2$ |
| Rate of incidence of peeling at tips of legs of heat dispersion plate after reflowing | 58/100 (58.0%) | 2/100 (2.0%) |

In addition, the down-offset portion described in the fifth embodiment may be formed on heat dispersion plate 7 of the present embodiment.

Although the method of the first embodiment was adopted for bonding together heat dispersion plate 7 and island 2 in the semiconductor package of this embodiment, this embodiment is not limited to this method, and any of the methods of bonding together heat dispersion plate 7 and island 2 described in the first to fourth embodiments may be applied to the package of this embodiment or to the package of an embodiment including a down-offset portion. For example, if the method of the second embodiment is applied, a package modification can thus be provided in which only the pointed portions of the tips of the legs of heat dispersion plate 7 are slightly exposed on the bottom surface of the package in the package shown in FIGS. 7A and 7B.

While preferred embodiments of the present invention have been described using specific terms, such description is for illustrative purposes only, and it is to be understood that changes and variations may be made without departing from the spirit or scope of the following claims.

What is claimed is:

1. A semiconductor package;
    a semiconductor element mounting portion on which a semiconductor element is mounted;
    inner leads arranged around the perimeter of said semiconductor element and electrically connected to electrodes on the surface of said semiconductor element;
    a heat dispersion plate having legs placed so as to overlap with said semiconductor element mounting portion;
    a resin-molded portion for encapsulating said semiconductor element mounting portion, said inner leads and said heat dispersion plate such that one portion of legs of said heat dispersion plate are exposed to a bottom surface of said resin-molded portion;

outer leads continuing with said inner leads and extending to the outside of said resin-molded portion;

a bonding layer interposed at least between said heat dispersion plate and said semiconductor element mounting portion; and in at least a first portion of said heat dispersion plate that overlaps with said semiconductor element mounting portion, bumps for supporting said semiconductor element mounting portion and slits for allowing passage of resin that forms said resin-molded portion, wherein said bonding layer comprises resin forming said resin-molded portion.

2. A semiconductor package according to claim 1 wherein a second portion of said heat dispersion plate, that is separate from the first portion in which said heat dispersion plate overlaps with said semiconductor element mounting portion, forms a flat portion that is offset downwards with respect to said first portion so as to be disposed closer to said bottom surface of said resin-molded portion, so that said first and second portions are at least a predetermined distance away from said inner leads.

3. A semiconductor package according to claim 2 wherein the portions of the legs of said heat dispersion plate that are exposed to the bottom surface of said resin-molded portion form portions in which the tips of said legs are pointed and are not co-planar with respect to the bottom surface of said resin-molded portion.

4. A semiconductor package according to claim 1, wherein the first portion of the heat dispersion plate is one continuous plate, and wherein the slits are provided in a parallel manner with respect to each other.

5. A semiconductor package according to claim 1, wherein the bumps are triangular-shaped indentations with a top portion of each said triangular-shaped indentation contacting a bottom surface of said semiconductor element mounting portion.

* * * * *